(12) United States Patent
Youn

(10) Patent No.: US 11,903,235 B2
(45) Date of Patent: Feb. 13, 2024

(54) TRANSPARENT DISPLAY DEVICE

(71) Applicant: LG Display Co., Ltd., Seoul (KR)

(72) Inventor: Jun-Ho Youn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/961,398

(22) Filed: Oct. 6, 2022

(65) Prior Publication Data

US 2023/0025996 A1    Jan. 26, 2023

Related U.S. Application Data

(63) Continuation of application No. 17/109,040, filed on Dec. 1, 2020, now Pat. No. 11,495,768.

(30) Foreign Application Priority Data

Dec. 9, 2019 (KR) .......................... 10-2019-0162778

(51) Int. Cl.
| | |
|---|---|
| H01L 27/14 | (2006.01) |
| H10K 50/824 | (2023.01) |
| H10K 59/122 | (2023.01) |
| H10K 59/131 | (2023.01) |
| H10K 71/00 | (2023.01) |
| G09G 3/32 | (2016.01) |
| G09G 3/20 | (2006.01) |
| H10K 59/35 | (2023.01) |
| H10K 59/12 | (2023.01) |

(52) U.S. Cl.
CPC ......... *H10K 50/824* (2023.02); *H10K 59/122* (2023.02); *H10K 59/1315* (2023.02); *H10K 71/00* (2023.02); *G09G 3/2007* (2013.01); *G09G 3/32* (2013.01); *G09G 2300/0465* (2013.01); *G09G 2320/0233* (2013.01); *G09G 2320/043* (2013.01); *H10K 59/1201* (2023.02); *H10K 59/352* (2023.02)

(58) Field of Classification Search
CPC ............ H10K 59/122; H10K 59/1315; H10K 59/1201; H10K 50/824
USPC .......................................................... 257/72
See application file for complete search history.

(56) References Cited

U.S. PATENT DOCUMENTS

| | | | |
|---|---|---|---|
| 9,966,554 B2 | 5/2018 | Lee et al. | |
| 10,593,905 B2 | 3/2020 | Lee et al. | |
| 2017/0133620 A1 | 5/2017 | Lee et al. | |
| 2018/0190935 A1* | 7/2018 | Kim ..................... | H10K 50/828 |
| 2018/0226606 A1 | 8/2018 | Lee et al. | |

(Continued)

FOREIGN PATENT DOCUMENTS

KR    10-2017-0054665 A    5/2017

*Primary Examiner* — Phuc T Dang
(74) *Attorney, Agent, or Firm* — Fenwick & West LLP

(57) ABSTRACT

A transparent display device includes a substrate having an emission area and a transparent area, a light-emitting diode provided in the emission area and including a first electrode, a light-emitting layer and a second electrode, a first connection pattern provided between the emission area and the transparent area and formed of a same material and on a same layer as the first electrode, and a second connection pattern provided in the transparent area and connected to the first connection pattern, wherein the second electrode overlaps the first and second connection patterns and are electrically connected to the first and second connection patterns.

20 Claims, 22 Drawing Sheets

(56) References Cited

U.S. PATENT DOCUMENTS

2019/0181345 A1\* 6/2019 Hwang ................ H10K 71/00
2019/0348627 A1 11/2019 Lee et al.

\* cited by examiner

TRANSPARENT DISPLAY DEVICE

CROSS-REFERENCE TO RELATED APPLICATIONS

The present application is a continuation application of U.S. patent application Ser. No. 17/109,040, filed Dec. 1, 2020, which claims priority from and the benefit under 35 U.S.C § 119(a) of Republic of Korea Patent Application No. 10-2019-0162778 filed on Dec. 9, 2019, all of which are hereby incorporated by reference in its entirety.

BACKGROUND

Field of the Disclosure

The present disclosure relates to a display device, and more particularly, to a transparent display device having an emission area and a transparent area.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids, and particularly, the electroluminescent display device can be manufactured at low costs.

Recently, a transparent display device using an electroluminescent display device has been widely developed. The transparent display device is a display device in which backgrounds behind a screen are visible. Therefore, image information and the surrounding environment may be displayed together.

The transparent display device using an electroluminescent display device includes a plurality of pixels, each of which has red, green, and blue emission areas. By selectively driving the red, green, and blue emission areas, various color images are displayed.

Red, green, and blue light-emitting layers are provided in the red, green, and blue sub-pixels, respectively, and each light-emitting layer is formed through a vacuum thermal evaporation process in which a luminescent material is selectively deposited using a fine metal mask (FMM).

However, in the transparent display device using an electroluminescent display device, since the size of the emission area is relatively small, it is not easy to form the light-emitting layer through the evaporation process.

In addition, the evaporation process increases manufacturing costs due to preparation of the mask and has a problem in application to a large-sized and high-definition display device due to manufacturing variations, sagging, shadow effect of the mask, and the like.

SUMMARY

Accordingly, the present disclosure is directed to a transparent display device that substantially obviates one or more of the problems due to limitations and disadvantages of the related art.

An object of the present disclosure is to provide a transparent display device having a large size and high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided a transparent display device that includes a substrate having an emission area and a transparent area, a light-emitting diode provided in the emission area and including a first electrode, a light-emitting layer and a second electrode, a first connection pattern provided between the emission area and the transparent area and formed of a same material and on a same layer as the first electrode, and a second connection pattern provided in the transparent area and connected to the first connection pattern, wherein the second electrode overlaps the first and second connection patterns and are electrically connected to the first and second connection patterns.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure.

DETAILED DESCRIPTION

Reference will now be made in detail to exemplary embodiments of the disclosure, examples of which are illustrated in the accompanying drawings.

A transparent display device according to an embodiment of the present disclosure displays an image using an electroluminescent display device. The transparent display device using an electroluminescent display device includes a plurality of pixels to display an image, and each of the plurality of pixels includes red, green and blue sub-pixels. First, second and third sub-pixel regions corresponding to the red, green and blue sub-pixels can have a configuration shown in FIG. 1.

Figure 1:
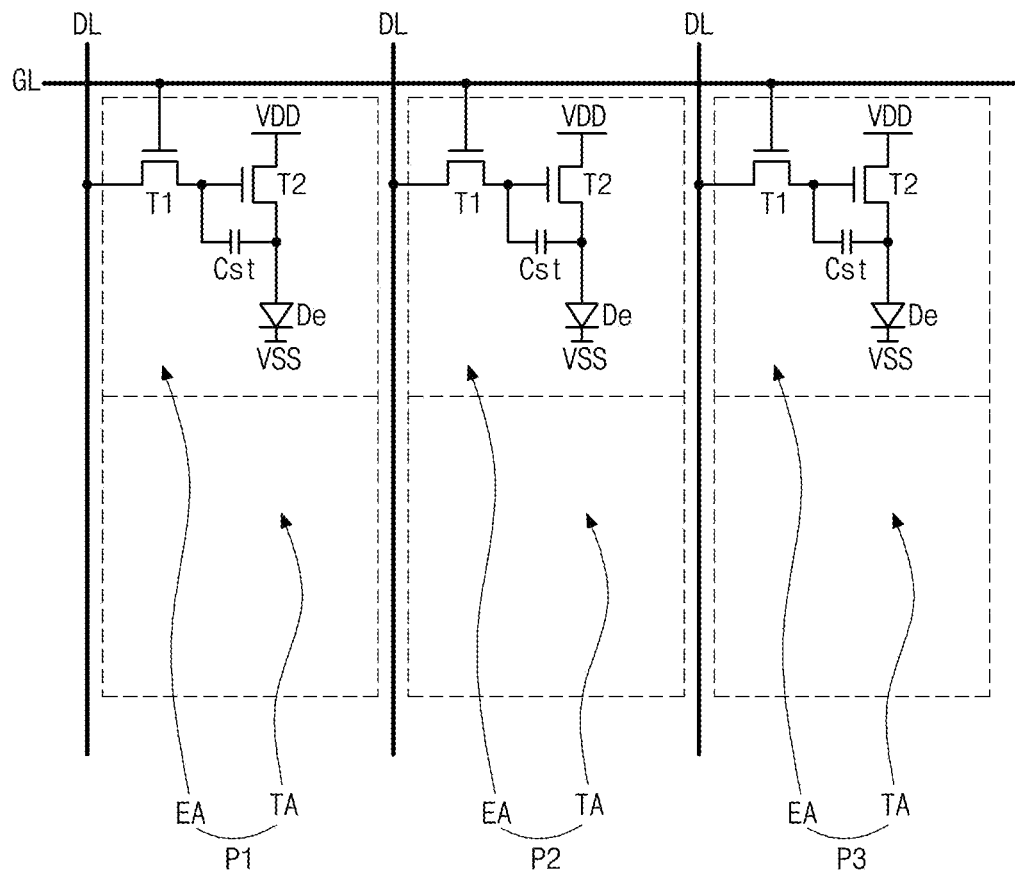
FIG. 1 is a circuit diagram of one pixel of a transparent display device according to an embodiment of the present disclosure.

FIG. 1 is a circuit diagram of one pixel of a transparent display device according to an embodiment of the present disclosure.

In FIG. 1, the transparent display device according to the embodiment of the present disclosure includes a plurality of gate lines and a plurality of data lines crossing each other to define sub-pixel regions. Particularly, in the example of FIG. 1, a gate line GL and data lines DL cross each other to define first, second and third sub-pixel regions P1, P2 and P3. Each of the first, second and third sub-pixel regions P1, P2 and P3 includes an emission area EA and a transparent area TA. Accordingly, one pixel can include three emission areas EA and three transparent areas TA.

Alternatively, the transparent areas TA of the first, second and third sub-pixel regions P1, P2 and P3 can be connected to each other and provided as one body. That is, one pixel can include three emission areas EA and one transparent area TA, but is not limited thereto.

The transparent display device according to the embodiment of the present disclosure display shows together the surrounding environment information such as backgrounds through the transparent areas TA while displaying the image information through the emission areas EA.

A switching thin film transistor T1, a driving thin film transistor T2, a storage capacitor Cst, and a light-emitting diode De are formed in the emission area of each of the first, second and third sub-pixel regions P1, P2 and P3, in each pixel region P.

More specifically, the gate line GL extends in a horizontal direction, and the data lines DL extend in a vertical direction. The first, second and third sub-pixel regions P1, P2 and P3 are sequentially arranged along the horizontal direction.

The emission area EA and the transparent area TA of each sub-pixel region P1, P2 and P3 can be arranged along the vertical direction.

In the emission area EA of each sub-pixel region P1, P2 and P3, a gate electrode of the switching thin film transistor T1 is connected to the gate line GL and a source electrode of the switching thin film transistor T1 is connected to the data line DL. A gate electrode of the driving thin film transistor T2 is connected to a drain electrode of the switching thin film transistor T1 and a source electrode of the driving thin film transistor T2 is connected to a high voltage supply VDD. An anode of the light-emitting diode De is connected to a drain electrode of the driving thin film transistor T2, and a cathode of the light-emitting diode De is connected to a low voltage supply VSS. The storage capacitor Cst is connected to the gate electrode and the drain electrode of the driving thin film transistor T2.

The transparent display device using an electroluminescent display device is driven to display an image. For example, when the switching thin film transistor T1 is turned on by a gate signal applied through the gate line GL, a data signal from the data line DL is applied to the gate electrode of the driving thin film transistor T2 and an electrode of the storage capacitor Cst through the switching thin film transistor T1.

When the driving thin film transistor T2 is turned on by the data signal, an electric current flowing through the light-emitting diode De is controlled, thereby displaying an image. The light-emitting diode De emits light due to the current supplied through the driving thin film transistor T2 from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the first, second and third sub-pixel regions P1, P2 and P3 show different gray levels depending on the magnitude of the data signal, and as a result, the transparent display device displays an image.

In addition, the storage capacitor Cst maintains charges corresponding to the data signal for a frame when the switching thin film transistor T1 is turned off. Accordingly, even if the switching thin film transistor T1 is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in each sub-pixel region P1, P2 and P3 in addition to the switching and driving thin film transistors T1 and T2 and the storage capacitor Cst.

For example, in the transparent display device using an electroluminescent display device, the driving thin film transistor T2 is turned on for a relatively long time while the data signal is applied to the gate electrode of the driving thin film transistor T2 and the light-emitting diode De emits light to thereby display the gray level. The driving thin film transistor T2 can deteriorate due to application of the data signal for a long time. Therefore, the mobility and/or threshold voltage Vth of the driving thin film transistor T2 are changed, and thus the pixel region P of the electroluminescent display device displays a different gray level with respect to the same data signal. This causes non-uniform luminance, thereby lowering the image quality of the display device.

Accordingly, to compensate the change of the mobility and/or threshold voltage of the driving thin film transistor T2, at least one sensing thin film transistor and/or capacitor for sensing a voltage change can be further added in each sub-pixel region P1, P2 and P3. The sensing thin film transistor and/or capacitor can be connected to a reference line for applying a reference voltage and outputting a sensing voltage.

The transparent display device can be classified into a bottom emission type and a top emission type according to an emission direction of the electroluminescent display device used therefor. In the bottom emission type display device, light from the light-emitting diode De is output toward a substrate on which the thin film transistors T1 and T2 are formed through the anode, and in the top emission type display device, light from the light-emitting diode De is output toward a direction opposite the substrate through the cathode. In general, since the thin film transistors T1 and T2 are formed under the light-emitting diode De in the electroluminescent display device, the size of an effective emission area is limited due to the thin film transistors T1 and T2 in the bottom emission type display device, and the top emission type display device has the larger effective emission area than the bottom emission type display device. Therefore, the top emission type display device has a higher aperture ratio than the bottom emission type display device, so that the top emission type display device is widely used for a display device with a large size and high definition.

Since the cathode is mostly formed of a metal material, the cathode may be formed to a relatively thin thickness in the top emission type display device such that light is output through the cathode. Accordingly, the resistance of the cathode increases, and a VSS voltage drop occurs due to the resistance of the cathode in the display device with a large size and high definition, thereby causing a problem of non-uniform brightness.

Therefore, the transparent display device according to the embodiment of the present disclosure has a structure for lowering the resistance of the cathode.

Figure 2:
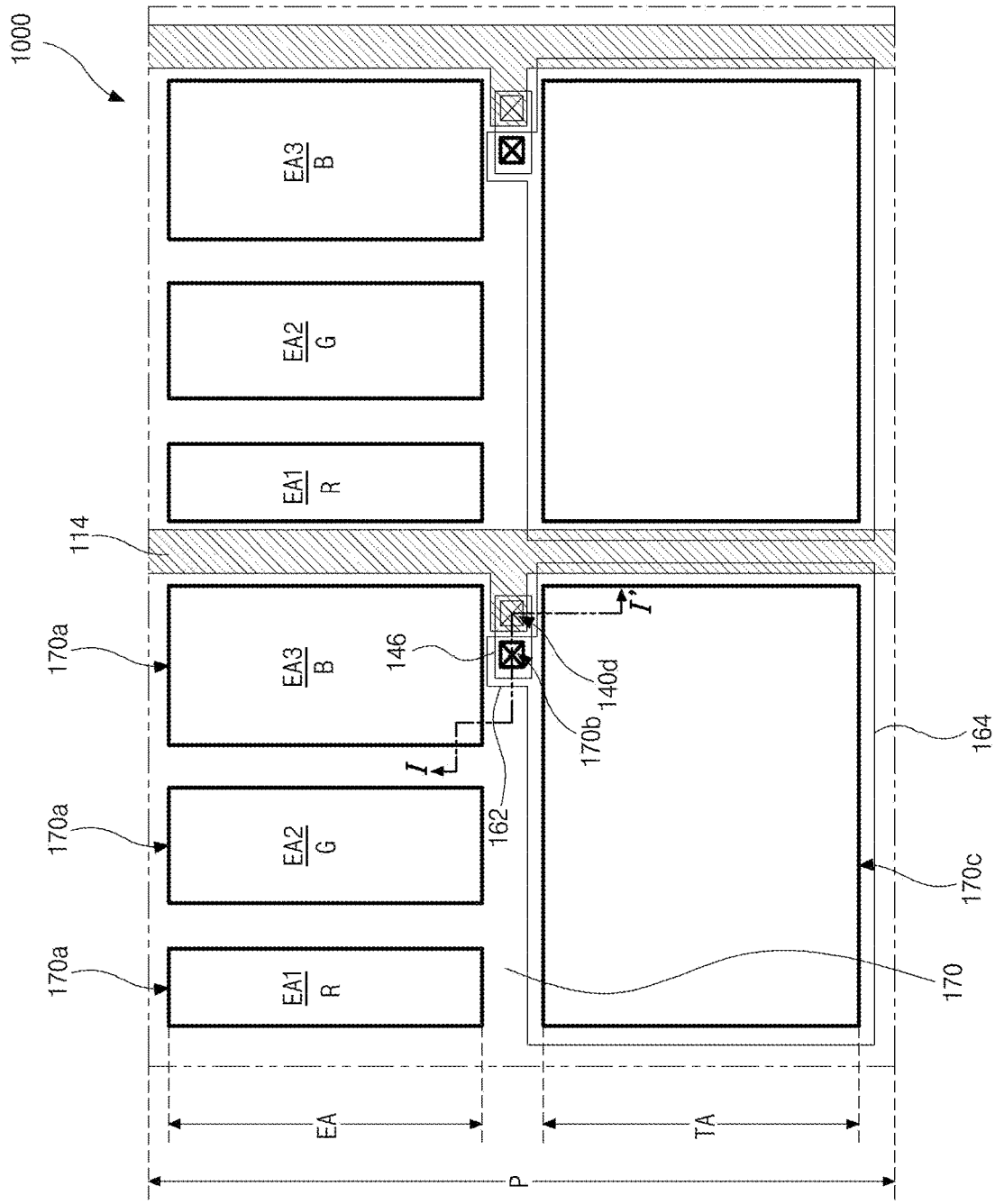
FIG. 2 is a schematic plan view of a transparent display device according to a first embodiment of the present disclosure.

FIG. 2 is a schematic plan view of a transparent display device according to a first embodiment of the present disclosure and mainly shows a bank configuration.

As shown in FIG. 2, in the transparent display device 1000 according to the first embodiment of the present disclosure, one pixel P includes an emission area EA and a transparent area TA. At this time, one pixel P can include three emission areas EA and one transparent area TA, and each of the emission areas EA has the same configuration except for the size.

More particularly, the pixel P can include red, green and blue sub-pixels, and each of the red, green and blue sub-pixels can include the emission area EA and the transparent area TA. At this time, the emission area EA can include first, second and third emission areas EA1, EA2 and EA3 corresponding to the red, green and blue sub-pixels, respectively. In addition, the transparent area TA of each of the red, green and blue sub-pixels can be connected to each other and formed as one body. Alternatively, the transparent area TA can be separated for each of the red, green and blue sub-pixels.

The emission area EA and the transparent area TA are arranged along a first direction (e.g., vertical direction), and the first, second and third emission areas EA1, EA2 and EA3 are arranged along a second direction (e.g., horizontal direction) perpendicular to the first direction.

Here, the first, second and third emission areas EA1, EA2 and EA3 can have different sizes. For example, the size of the second emission area EA2 of the green sub-pixel can be larger than the size of the first emission area EA1 of the red sub-pixel and smaller than the size of the third emission area EA3 of the blue sub-pixel, but is not limited thereto. In this case, the first, second and third emission areas EA1, EA2 and EA3 can have the same length along the first direction and different widths along the second direction, but is not limited thereto.

Since light-emitting diodes provided at respective sub-pixels are formed of light-emitting materials having different properties, the light-emitting diodes have different lifetimes and efficiencies, and the lifetime of the display device can be lowered by the difference in the lifetimes of the light-emitting diodes. Accordingly, in the present disclosure, by differentiating the sizes of the first, second and third emission areas EA1, EA2 and EA3 of the red, green and blue sub-pixels, the lifetimes and efficiencies of the light-emitting diodes provided at respective sub-pixels can be optimized, thereby solving the problem of lowering the lifetime of the device and thus improving the lifetime of the display device.

A bank 170 is formed between the first, second and third emission areas EA1, EA2 and EA3 and between the emission area EA and the transparent area TA. The bank 170 has a first opening 170a corresponding to each of the first, second and third emission areas EA1, EA2 and EA3 and a second opening 170c corresponding to the transparent area TA.

Here, the second opening 170c is formed as a single opening corresponding to the transparent areas TA of the first, second and third sub-pixel regions P1, P2 and P3. Alternatively, the second opening 170c can be divided into and separately formed for the first, second and third sub-pixel regions P1, P2 and P3.

Each of the first and second openings 170a and 170c is illustrated as having a rectangular shape, but is not limited thereto. Each of the first and second openings 170a and 170c can have various shapes such as a rectangular shape with rounded corners, an oval shape, or the like.

Meanwhile, first and second auxiliary electrodes 114 and 146 and first and second connection patterns 162 and 164 are formed under the bank 170.

The first auxiliary electrode 114 can be provided as a line shape extending along the first direction, and one first auxiliary electrode 114 can be disposed between adjacent pixels P along the second direction.

The second auxiliary electrode 146 is disposed between the emission area EA and the transparent area TA and partially overlaps the first auxiliary electrode 114. The second auxiliary electrode 146 is connected to the first auxiliary electrode 114 through a contact hole 140d.

Here, the first auxiliary electrode 114 can include a protrusion part between the emission area EA and the transparent area TA, and the second auxiliary electrode 146 can overlap the protrusion part of the first auxiliary electrode 114. However, the present disclosure is not limited.

In addition, the first connection pattern 162 is disposed between the emission area EA and the transparent area TA and partially overlaps the second auxiliary electrode 146. The bank 170 has an auxiliary contact hole 170b corresponding to the first connection pattern 162. The first connection pattern 162 is connected to the second auxiliary electrode 146 through a contact hole (not shown) under the auxiliary contact hole 170b.

The second connection pattern 164 is disposed to correspond to the transparent area TA and is exposed through the second opening 170c. The second connection pattern 164 is in direct contact with the first connection pattern 162. The second connection pattern 164 can overlap and cover the first connection pattern 162. Alternatively, the second connection pattern 164 can extend from the first connection pattern 162.

Meanwhile, although not shown in the figure, a first electrode is formed of a same material as the first connection pattern 162 in each of the first, second and third emission areas EA1, EA2 and EA3, and the first electrode is exposed through the first opening 170a. A light-emitting layer is formed on the exposed first electrode, and a second electrode is formed on the light-emitting layer. The first electrode, the light-emitting layer and the second electrode constitute a light-emitting diode. The first electrode serves as an anode, and the second electrode serves as a cathode.

At this time, the second electrode is formed substantially over an entire surface of a substrate and is electrically connected to the first connection pattern 162 thereunder through the auxiliary contact hole 170b. The second electrode is also electrically connected to the first and second auxiliary electrodes 114 and 146 through the first connection pattern 162, and thus the resistance of the second electrode, that is, the resistance of the cathode can be decreased.

Further, the second electrode is also disposed in the transparent area TA and is electrically connected to the second connection pattern 164 through the second opening 170c. The second electrode is electrically connected to the first connection pattern 162 and the first and second auxiliary electrodes 114 and 146 through the second connection pattern 164.

Here, the contact resistance is generated between the second electrode and the first connection pattern 162, and the luminous efficiency deceases as the contact resistance increases. The contact resistance can decrease by increasing the size of the auxiliary contact hole 170b. However, when the size of the auxiliary contact hole 170b is increased, the sizes of the emission area EA and/or the transparent area TA are decreased, thereby lowering the aperture ratio of the pixel P.

Accordingly, in the transparent display device 1000 according to the first embodiment of the present disclosure, while the aperture ratio of the pixel P is maximumly or increasingly secured by reducing or minimizing the size of the auxiliary contact hole 170b, the contact resistance of the second electrode can be reduced by electrically connecting the second electrode to the second connection pattern 164 as well as the first connection pattern 162.

A cross-sectional structure of the transparent display device 1000 according to the first embodiment of the present disclosure will be described in detail with reference to FIG. 3.

Figure 3:
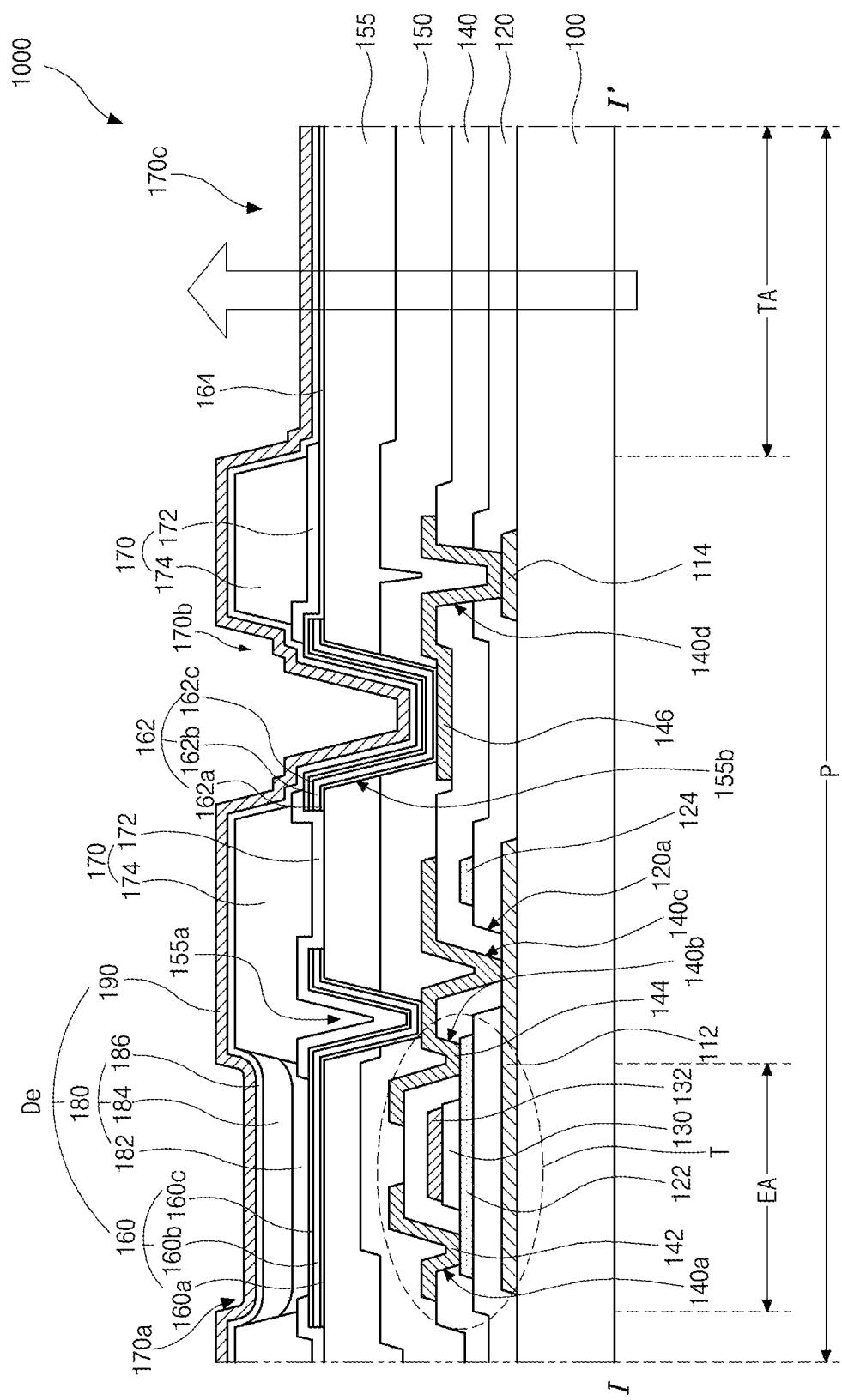
FIG. 3 is a schematic cross-sectional view of the transparent display device according to the first embodiment of the present disclosure and corresponds to the line I-I' of FIG. 2.

FIG. 3 is a schematic cross-sectional view of the transparent display device according to the first embodiment of the present disclosure and corresponds to the line I-I' of FIG. 2.

As shown in FIG. 3, in the transparent display device 1000 according to the first embodiment of the present disclosure, a pixel P including an emission area EA and a transparent area TA is defined on a substrate 100. A light-blocking pattern 112 and a first auxiliary electrode 114 of a first conductive material such as metal are formed on the substrate 100. Here, at least a part of the light-blocking pattern 112 can be disposed in the emission area EA, and the first auxiliary electrode 114 can be disposed between the emission area EA and the transparent area TA.

The substrate 100 can be a glass substrate or a plastic substrate. For example, polyimide can be used for the plastic substrate, but is not limited thereto.

Meanwhile, the first auxiliary electrode 114 can be provided as a line shape extending in the first direction.

The light-blocking pattern 112 and the first auxiliary electrode 114 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the light-blocking pattern 112 and the first auxiliary electrode 114 can have a double-layered structure including a lower layer of a molybdenum-titanium alloy (MoTi) and an upper layer of copper (Cu), and the upper layer can have a thicker thickness than the lower layer.

A buffer layer 120 is formed on the light-blocking pattern 112 and the first auxiliary electrode 114 substantially on an entire surface of the substrate 100. The buffer layer 120 can be formed of an inorganic insulating material such as silicon oxide ($SiO_2$) or silicon nitride ($SiN_x$) and can be formed as a single layer or multi layers.

Here, the buffer layer 120 has a buffer hole 120a on the light-blocking pattern 112, and a top surface of the light-blocking pattern 112 is partially exposed through the buffer hole 120a.

A semiconductor layer 122 and a capacitor electrode 124 are patterned and formed on the buffer layer 120. The semiconductor layer 122 and the capacitor electrode 124 are spaced apart from each other over the light-blocking pattern 112. The light-blocking pattern 112 blocks light incident on the semiconductor layer 122 and prevents the semiconductor layer 122 from deteriorating due to the light.

The semiconductor layer 122 and the capacitor electrode 124 can be formed of polycrystalline silicon, and in this case, both ends of the semiconductor layer 122 and the capacitor electrode 124 can be doped with impurities. Alternatively, the semiconductor layer 122 and the capacitor electrode 124 can be formed of an oxide semiconductor material.

A gate insulation layer 130 of an insulating material and a gate electrode 132 of a second conductive material such as metal are sequentially formed on the semiconductor layer 122. The gate insulation layer 130 and the gate electrode 132 are disposed to correspond to a center of the semiconductor layer 122.

The gate insulation layer 130 can be formed of an inorganic insulating material such as silicon oxide ($SiO_2$) or silicon nitride ($SiN_x$). When the semiconductor layer 122 is made of an oxide semiconductor material, it is preferable that the gate insulation layer 130 is formed of silicon oxide ($SiO_2$). Alternatively, when the semiconductor layer 122 is made of polycrystalline silicon, the gate insulation layer 130 can be formed of silicon oxide ($SiO_2$) or silicon nitride ($SiN_x$).

The gate electrode 132 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the gate electrode 132 can have a double-layered structure including a lower layer of a molybdenum-titanium alloy (MoTi) and an upper layer of copper (Cu), and the upper layer can have a thicker thickness than the lower layer.

As shown in the figure, the gate insulation layer 130 can be patterned to have the same shape as the gate electrode 132. At this time, a width of the gate insulation layer 130 can be wider than a width of the gate electrode 132, and thus, edges of a top surface of the gate insulation layer 130 can be exposed. Alternatively, the width of the gate insulation layer 130 can be the same as the width of the gate electrode 132.

Or, the gate insulation layer 130 may not be patterned and can be formed substantially over the entire surface of the substrate 100.

Meanwhile, a gate line (not shown) can be further formed of the same material and on the same layer as the gate electrode 132.

An interlayer insulation layer 140 made of an insulating material is formed on the gate electrode 132 substantially over the entire surface of the substrate 100. The interlayer insulation layer 140 can be formed of an inorganic insulating material such as silicon oxide ($SiO_2$) or silicon nitride ($SiN_x$). Alternatively, the interlayer insulation layer 140 can be formed of an organic insulating material such as photo acryl or benzocyclobutene.

The interlayer insulation layer 140 has first, second, third and fourth contact holes 140a, 140b, 140c and 140d. The first and second contact holes 140a and 140b expose the both ends of the semiconductor layer 122. The third contact hole 140c partially exposes the top surface of the light-blocking pattern 112 and is located in the buffer hole 120a. Alternatively, the buffer hole 120a may be omitted, and the third contact hole 140c can be formed in the buffer layer 120 as well as in the interlayer insulation layer 140 to partially expose the top surface of the light-blocking pattern 112. The fourth contact hole 140d is formed in the buffer layer 120 as well as in the interlayer insulation layer 140 to partially expose a top surface of the first auxiliary electrode 114.

Source and drain electrodes 142 and 144 and a second auxiliary electrode 146 made of a third conductive material such as metal are formed on the interlayer insulation layer 140. The source and drain electrodes 142 and 144 and the second auxiliary electrode 146 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the source and drain electrodes 142 and 144 and the second auxiliary electrode 146 can have a double-layered structure including a lower layer of a molybdenum-titanium alloy (MoTi) and an upper layer of copper (Cu), and the upper layer can have a thicker thickness than the lower layer. Alternatively, the source and drain electrodes 142 and 144 and the second auxiliary electrode 146 can have a triple-layered structure.

The source and drain electrodes 142 and 144 are spaced apart from each other with the gate electrode 132 positioned therebetween. The source and drain electrodes 142 and 144 contact the both ends of the semiconductor layer 122 through the first and second contact holes 140a and 140b, respectively. Further, the drain electrode 144 contacts the light-blocking pattern 112 through the third contact hole 140c and overlaps the capacitor electrode 124. The capacitor electrode 124 overlaps the light-blocking pattern 112 and the drain electrode 144 to form a storage capacitor.

Meanwhile, the second auxiliary electrode 146 contacts the first auxiliary electrode 114 through the fourth contact hole 140d.

In addition, a data line (not shown) and a high voltage supply line (not shown) can be further formed on the interlayer insulation layer 140 and can be made of the third conductive material.

The semiconductor layer 122, the gate electrode 132, and the source and drain electrodes 142 and 144 form a thin film transistor T. The thin film transistor T has a coplanar structure in which the gate electrode 132 and the source and drain electrodes 142 and 144 are located at the same side with respect to the semiconductor layer 122.

Alternatively, the thin film transistor T can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. In this case, the semiconductor layer can be formed of oxide semiconductor or amorphous silicon.

The thin film transistor T corresponds to a driving thin film transistor T2 of FIG. 1, and a switching thin film transistor T1 of FIG. 1 having the same structure as the driving thin film transistor T can be further formed on the substrate 100. The gate electrode 132 of the driving thin film transistor T can be connected to a drain electrode of the switching thin film transistor, and the source electrode 142 of the driving thin film transistor T is connected to the high voltage supply line. In addition, a gate electrode and a source electrode of the switching thin film transistor can be connected to the gate line and the data line, respectively.

A passivation layer 150 of an insulating material is formed on the source and drain electrodes 142 and 144 and the second auxiliary electrode 146 substantially over the entire surface of the substrate 100. The passivation layer 150 can be formed of an inorganic insulating material such as silicon oxide ($SiO_2$) or silicon nitride ($SiN_x$).

Next, an overcoat layer 155 of an insulating material is formed on the passivation layer 150 substantially over the entire surface of the substrate 100. The overcoat layer 155 can be formed of an organic insulating material such as photo acryl or benzocyclobutene. The overcoat layer 155 can eliminate level differences due to under layers and have a substantially flat top surface.

Here, one of the passivation layer 150 and the overcoat layer 155 can be omitted. For example, the passivation layer 150 can be omitted, but is not limited thereto.

The passivation layer 150 and the overcoat layer 155 have a drain contact hole 155a exposing the drain electrode 144. Further, the passivation layer 150 and the overcoat layer 155 have a fifth contact hole 155b exposing the second auxiliary electrode 146.

A first electrode 160 is formed on the overcoat layer 155 in the emission area EA and formed of a conductive material. The first electrode 160 is in contact with the drain electrode 144 through the drain contact hole 155a.

The first electrode 160 includes a first layer 160a, a second layer 160b and a third layer 160c. Here, the second layer 160b is disposed between the first layer 160a and the third layer 160, and the first layer 160a is disposed between the second layer 160b and the substrate 100, more particularly, between the second layer 160b and the overcoat layer 155.

The first layer 160a is formed to improve the adhesion property between the second layer 160b and the overcoat layer 155. The first layer 160a can be formed of a transparent conductive material such as indium tin oxide (ITO) or indium zinc oxide (IZO), but is not limited thereto. The first layer 160a can be omitted.

The second layer 160b is formed of a metal material having relatively high reflectance. For example, the second layer 160b can be formed of silver (Ag), aluminum (Al) or molybdenum (Mo).

The third layer 160c is formed of a conductive material having relatively high work function. For example, the third layer 160c can be formed of a transparent conductive material such as ITO or IZO. Here, the work function of the third layer 160c is higher than the work function of the second layer 160b.

A thickness of the second layer 160b can be greater than a thickness of the third layer 160c. For example, the thickness of the second layer 160b can be 80 nm to 100 nm, and the thickness of the third layer 160c can be 10 nm to 80 nm. However, the present disclosure is not limited thereto. A thickness of the first layer 160a can be smaller than the thickness of the second layer 160b and can be smaller than or equal to the thickness of the third layer 160c. For example, the thickness of the first layer 160a can be 10 nm, but is not limited thereto.

Meanwhile, a first connection pattern 162 is formed on the overcoat layer 155 between the emission area EA and the transparent area TA and is formed of the same material as the first electrode 160. Accordingly, the first connection pattern 162 can include first, second and third layers 162a, 162b and 162c. At this time, the second layer 162b is disposed between the first layer 162a and the third layer 162c, and the first layer 162a is disposed between the second layer 162b and the substrate 100, more particularly, between the second layer 162b and the overcoat layer 155. The first connection pattern 162 is in contact with the second auxiliary electrode 146 through the fifth contact hole 155b.

Further, a second connection pattern 164 is formed on the overcoat layer 155 in the transparent area TA. The second connection pattern 164 extends into an area between the emission area EA and the transparent area TA and overlaps and covers the first connection pattern 162. At this time, the second connection pattern 164 can overlap and cover at least a part of the first connection pattern 162.

The second connection pattern 164 contacts a top surface and a side surface of the first connection pattern 162. More particularly, the second connection pattern 164 is in contact with the top surface of the third layer 162c of the first connection pattern 162 and the side surfaces of the first, second and third layers 162a, 162b and 162c of the first connection pattern 162.

The second connection pattern 164, beneficially, is formed of a transparent conductive material such as ITO or IZO.

A bank 170 of an insulating material is formed on the first electrode 160 and the first and second connection patterns 162 and 164. The bank 170 overlaps and covers edges of each of the first electrode 160 and the first and second connection patterns 162 and 164.

The bank 170 has a first opening 170a, a second opening 170c and an auxiliary contact hole 170b. The first opening 170a corresponds to the emission area EA, the second opening 170c corresponds to the transparent area TA, and the auxiliary contact hole 170b is disposed in the area between emission area EA and the transparent area TA.

The first opening 170a exposes a central portion of the first electrode 160, the second opening 170c exposes a central portion of the second connection pattern 164, and the auxiliary contact hole 170b exposes a part of the first connection pattern 162.

The bank 170 includes a first bank 172 of a hydrophilic property and a second bank 174 of a hydrophobic property on the first bank 172. The second bank 174 has a narrower width than the first bank 172 and exposes edges of a top surface of the first bank 172. In addition, the second bank 174 can have a thicker thickness than the first bank 172.

The first bank 172 can be formed of a material having a hydrophilic property, for example, an inorganic insulating material such as silicon oxide ($SiO_2$) or silicon nitride ($SiN_x$). Alternatively, the first bank 172 can be formed of polyimide.

In addition, at least a top surface of the second bank 174 is hydrophobic, and a side surface of the second bank 174 can be hydrophobic or hydrophilic. The second bank 174 can be formed of an organic insulating material having a hydrophobic property. Alternatively, the second bank 174 can be formed of an organic insulating material having a hydrophilic property and subjected to a hydrophobic treatment.

Meanwhile, the first bank 172 and the second bank 174 are formed of different materials and separated from each other in FIG. 3. However, the hydrophilic first bank 172 and the hydrophobic second bank 174 can be formed of the same material and formed as one body. For example, an organic material layer can be formed substantially over the entire surface of the substrate 100, can be exposed to light through a halftone mask including a light-transmitting portion, a light-blocking portion and a half light-transmitting portion, and can be patterned, thereby forming the hydrophilic first bank 172 and the hydrophobic second bank 174.

Alternatively, the first bank 172 can be omitted.

A light-emitting layer 180 is formed on the first electrode 160 exposed through the first opening 170a. The light-emitting layer 180 can include a first charge auxiliary layer 182, a light-emitting material layer 184, and a second charge auxiliary layer 186 that are sequentially positioned over the first electrode 160.

The light-emitting material layer 184 can be formed of any one of red, green and blue luminescent materials corresponding to the red, green and blue sub-pixels, respectively. For example, the light-emitting material layer 184 can be formed of a blue luminescent material. The luminescent material can be an organic luminescent material such as a phosphorescent compound or a fluorescent compound or can be an inorganic luminescent material such as a quantum dot.

The first charge auxiliary layer 182 can be a hole auxiliary layer, and the hole auxiliary layer can include at least one of a hole injecting layer (HIL) and a hole transporting layer (HTL). In addition, the second charge auxiliary layer 186 can be an electron auxiliary layer, and the electron auxiliary layer can include at least one of an electron injecting layer (EIL) and an electron transporting layer (ETL). However, the present disclosure is not limited thereto.

Here, each of the first charge auxiliary layer 182 and the light-emitting material layer 184 is formed through a solution process. Thus, the process can be simplified and a display device with a large size and high resolution can be provided. A spin coating method, an ink jet printing method, or a screen printing method can be used as the solution process, but the present disclosure is not limited thereto. When the solution is dried, a drying speed of a solvent in a region adjacent to the second bank 174 is different from that in other regions. That is, the drying speed of the solvent in the region adjacent to the second bank 174 is faster than that in the other regions. Therefore, a height of each of the first charge auxiliary layer 182 and the light-emitting material layer 184 in the region adjacent to the second bank 174 can rise as it gets closer to the second bank 174.

Meanwhile, the second charge auxiliary layer 186 can be formed through a thermal evaporation process. Accordingly, the second charge auxiliary layer 186 can be formed substantially over the entire surface of the substrate 100. That is, the second charge auxiliary layer 186 can be formed on the top surface and the side surface of the second bank 174 and can also be formed on the first connection pattern 162 and the second connection pattern 164. The second charge auxiliary layer 186 is in contact with the top surface and the side surface of the second bank 174 and is also in contact with the second connection pattern 164.

Alternatively, the second charge auxiliary layer 186 can be formed through the solution process. In this case, the second charge auxiliary layer 186 can be formed in the first opening 170a similarly to the first charge auxiliary layer 182 and the light-emitting material layer 184 and a height of the second charge auxiliary layer 186 in the region adjacent to the second bank 174 can rise as it gets closer to the second bank 174.

A second electrode 190 of a conductive material having a relatively low work function is formed on the light-emitting layer 180, the second bank 174 and the first and second connection patterns 162 and 164 substantially over the entire surface of the substrate 100. The second electrode 190 can be formed of aluminum (Al), magnesium (Mg), silver (Ag), or an alloy thereof. At this time, the second electrode 190 has a relatively thin thickness such that light from the light-emitting layer 180 can be transmitted therethrough. For example, the second electrode 190 can have the thickness of 5 nm to 10 nm.

Alternatively, the second electrode 190 can be formed of a transparent conductive material such as indium-gallium-oxide (IGO) or IZO, but is not limited thereto.

The second electrode 190 is electrically connected to the first connection pattern 162 through the auxiliary contact hole 170b. At this time, the second electrode 190 can be electrically connected to the first connection pattern 162 through the second connection pattern 164 formed on the first connection pattern 162.

In addition, the second electrode 190 is electrically connected to the second connection pattern 164 through the second opening 170c. Accordingly, an area for electrical connection of the second electrode 190 increases, so that the contact property between the second electrode 190 and the first connection pattern 162 can be improved.

As described above, when the second charge auxiliary layer 186 is formed through the solution process, the second electrode 190 can contact the second connection pattern 164.

The first electrode 160, the light-emitting layer 180 and the second electrode 190 constitute a light-emitting diode De. The first electrode 160 can serve as an anode, and the second electrode 190 can serve as a cathode, but is not limited thereto.

As described above, the transparent display device 1000 according to the embodiment of the present disclosure can be a top emission type in which light from the light-emitting layer 180 of the light-emitting diode De is output toward a direction opposite the substrate 100, that is, output to the outside through the second electrode 190. The top emission type display device can have a wider emission area than a bottom emission type display device of the same size, to thereby improve luminance and reduce power consumption.

At this time, the light-emitting diode De of each sub-pixel can have an element thickness for a micro-cavity effect corresponding to a wavelength of the emitted light, thereby increasing the light efficiency.

In the meantime, a protective layer and/or an encapsulating layer (not shown) can be formed on the second electrode 190 substantially over the entire surface of the substrate 110 to block moisture or oxygen introduced from the outside, thereby protecting the light-emitting diode De.

In addition, a capping layer (not shown) can be formed on the second electrode 190 substantially over the entire surface of the substrate 100. The capping layer can be formed of an insulating material having a relatively high refractive index. The wavelength of light traveling along the capping layer can be amplified by surface plasma resonance, and thus the intensity of the peak can be increased, thereby improving the light efficiency in the top emission type electroluminescent display device. For example, the capping layer can be formed as a single layer of an organic layer or an inorganic layer or formed as organic/inorganic stacked layers.

As described above, in the transparent display device 1000 according to the first embodiment of the present disclosure, the pixel P includes the emission area EA and the transparent area TA, so that the surrounding environment information such as backgrounds can be shown together through the transparent area TA while displaying the image information through the emission area EA.

In addition, in the transparent display device 1000 according to the first embodiment of the present disclosure, by forming some of the light-emitting layer 180 through the solution process, a fine metal mask can be omitted to thereby reduce the manufacturing costs, and a display device with a large size and high definition can be implemented.

Further, the transparent display device 1000 according to the first embodiment of the present disclosure is implemented as the top emission type, thereby improving the luminance and reducing the power consumption. Here, since the second electrode 190 is formed to have the relatively thin thickness in order to transmit light, the resistance of the second electrode 190 can be increased, but the resistance of the second electrode 190 can be lowered by connecting the second electrode 190 to the first and second auxiliary electrodes 114 and 146 through the first connection pattern 162. At this time, the second electrode 190 is also electrically connected to the second connection pattern 164 of the transparent area TA, so that the electrical contact property between the second electrode 190 and the first connection pattern 162 can be improved.

A manufacturing method of the transparent display device 1000 according to the first embodiment of the present disclosure will be described in detail with reference to FIGS. 4A to 4G.

FIGS. 4A to 4G are cross-sectional views schematically illustrating a manufacturing process of a transparent display device according to the first embodiment of the present disclosure.

Figure 4A:
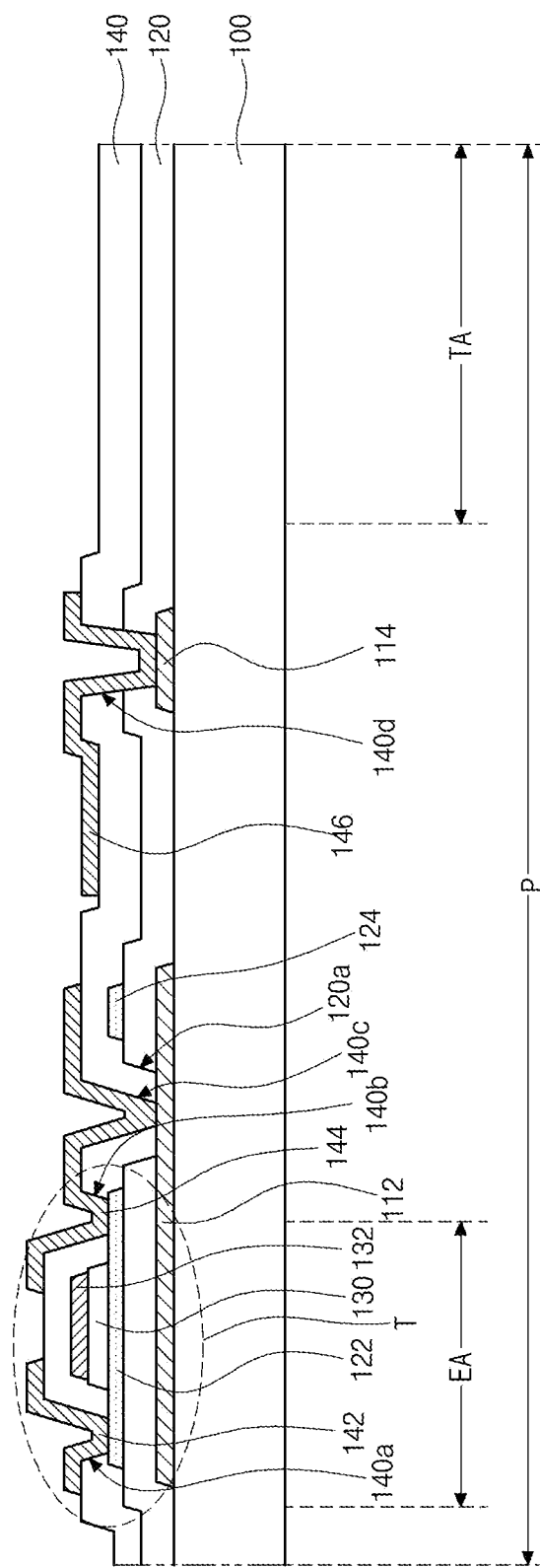
FIGS. 4A to 4G are cross-sectional views schematically illustrating a manufacturing process of a transparent display device according to the first embodiment of the present disclosure.

In FIG. 4A, a light-blocking pattern 112 and a first auxiliary electrode 114 are formed on a substrate 100 on which a pixel P including an emission area EA and a transparent area TA is defined by depositing a first conductive material and patterning it through a first mask process.

Next, a buffer layer 120 is formed on the light-blocking pattern 112 and the first auxiliary electrode 114 by depositing an inorganic insulating material substantially over an entire surface of the substrate 100 and is patterned through a second mask process, thereby forming a buffer hole 120a partially exposing an upper surface of the light-blocking pattern 112.

Then, a semiconductor layer 122 and a capacitor electrode 124 are formed on the buffer layer 120 by depositing a semiconductor material and patterning it through a third mask process. The semiconductor layer 122 and the capacitor electrode 124 are spaced apart from each other over the light-blocking pattern 112.

The semiconductor material can be polycrystalline silicon, and in this case, both ends of the semiconductor layer 122 and the capacitor electrode 124 can be doped with impurities later. Alternatively, the semiconductor material can be formed of an oxide semiconductor material.

A gate insulation layer 130 and a gate electrode 132 are formed by sequentially depositing an inorganic insulating material and a second conductive material on the semiconductor layer 122 and the capacitor electrode 124 and patterning them through a fourth mask process. The gate insulation layer 130 and the gate electrode 132 are disposed to correspond to a center of the semiconductor layer 122.

Then, an interlayer insulation layer 140 is formed on the gate electrode 132 and the capacitor electrode 124 by depositing an inorganic insulating material or applying an organic insulating material substantially over the entire surface of the substrate 100 and is patterned through a fifth mask process, thereby forming first, second, third, and fourth contact holes 140a, 140b, 140c, and 140d. At this time, the buffer layer 120 can also be selectively removed.

The first and second contact holes 140a and 140b expose the both ends of the semiconductor layer 122. The third contact hole 140c partially exposes the upper surface of the light-blocking pattern 112 corresponding to the buffer hole 120a. Here, the buffer hole 120a can be omitted, and the third contact hole 140c can be formed in the buffer layer 120 as well as in the interlayer insulation layer 140 to partially expose the upper surface of the light-blocking pattern 112. In this case, the second mask process is omitted. In addition, the fourth contact hole 140d is formed in the buffer layer 120 as well as in the interlayer insulation layer 140 to partially expose an upper surface of the first auxiliary electrode 114.

Next, source and drain electrodes 142 and 144 and a second auxiliary electrode 146 are formed on the interlayer insulation layer 140 by depositing a third conductive material and patterning it through a sixth mask process.

The source and drain electrodes 142 and 144 are in contact with the both ends of the semiconductor layer 122 through the first and second contact holes 140a and 140b, respectively. Further, the drain electrode 144 contacts the light-blocking pattern 112 through the third contact hole 140c and overlaps the capacitor electrode 124.

Meanwhile, the second auxiliary electrode 146 contacts the first auxiliary electrode 114 through the fourth contact hole 140d.

The semiconductor layer 122, the gate electrode 132, and the source and drain electrodes 142 and 144 form a thin film transistor T. The capacitor electrode 124 overlaps the light-blocking pattern 112 and the drain electrode 144 to form a storage capacitor.

Figure 4B:
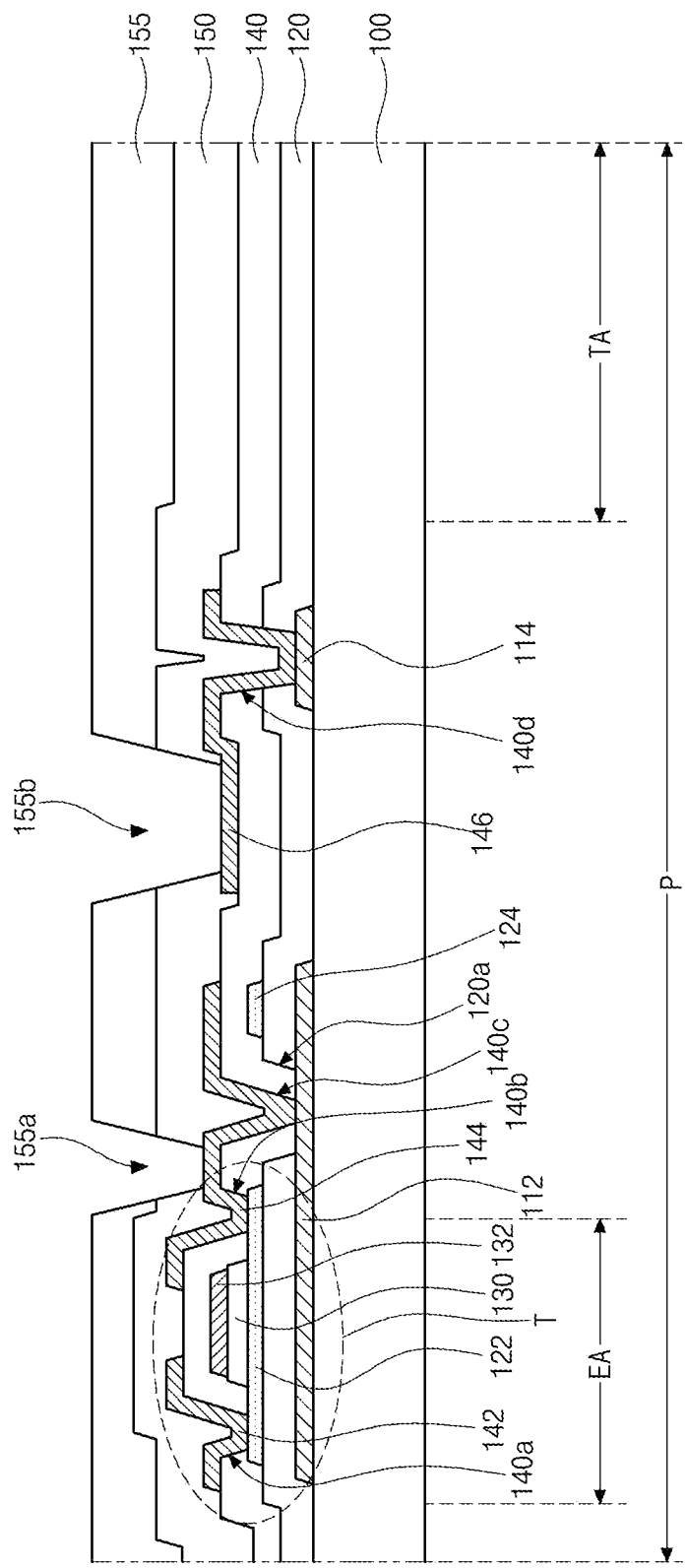

Next, in FIG. 4B, a passivation layer 150 is formed on the source and drain electrodes 142 and 144 and the second auxiliary electrode 146 by depositing an inorganic insulating material, and an overcoat layer 155 is formed on the passivation layer 150 by applying an organic insulating material. Then, the passivation layer 150 and the overcoat layer 155 are patterned through a seventh mask process, thereby forming a drain contact hole 155a and a fifth contact hole 155b.

The drain contact hole 155a partially exposes the drain electrode 144, and the fifth contact hole 155b exposes the second auxiliary electrode 146.

Here, it is described that the passivation layer 150 and the overcoat layer 155 are patterned through the same mask process, but the passivation layer 150 and the overcoat layer 155 can be patterned through different mask processes. That is, after the passivation layer 150 is formed by depositing an inorganic insulating material and patterned through a mask process, the overcoat layer 155 can be formed by applying an organic insulating material and can be patterned through another mask process.

Figure 4C:
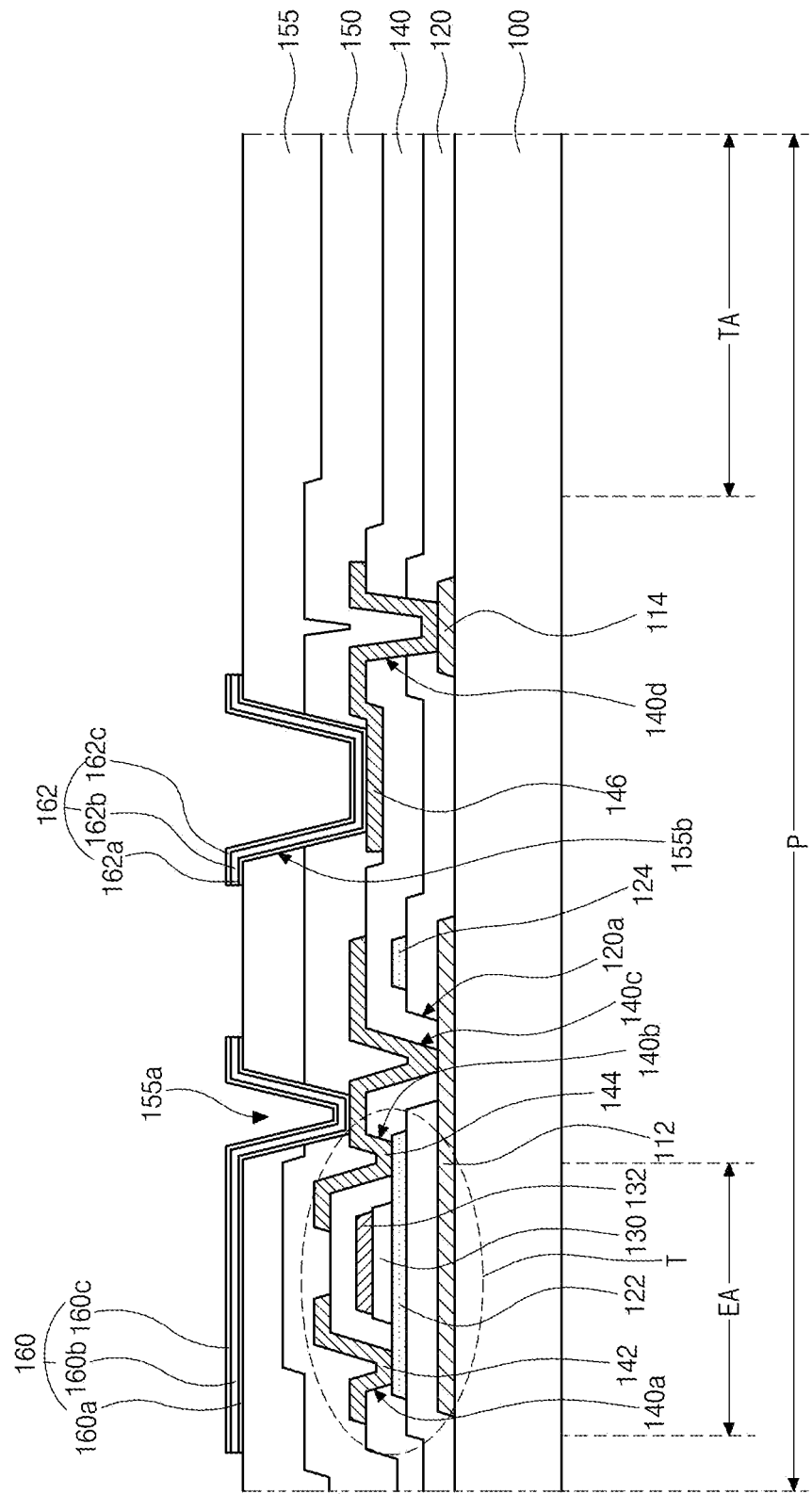

Next, as shown in FIG. 4C, a first electrode 160 and a first connection pattern 162 are formed on the overcoat layer 155 by sequentially depositing first, second and third conductive layers (not shown) and patterning them through an eighth mask process.

Here, the first and third conductive layers can be formed of ITO or IZO, and the second conductive layer can be formed of silver (Ag), aluminum (Al) or molybdenum (Mo).

The first electrode 160 and the first connection pattern 162 include a first layer 160a and 162a, a second layer 160b and 162b, and a third layer 160c and 162c. The second layer 160b and 162b is disposed between the first layer 160a and 162a and the third layer 160c and 162c, and the first layer 160a and 162a is disposed between the second layer 160b and 162b and the overcoat layer 155.

The first electrode 160 is disposed in the emission area EA and is in contact with the drain electrode 144 through the drain contact hole 155a. In addition, the first connection pattern 162 is disposed between the emission area EA and the transparent area TA and is in contact with the second auxiliary electrode 146 through the fifth contact hole 155b.

Figure 4D:
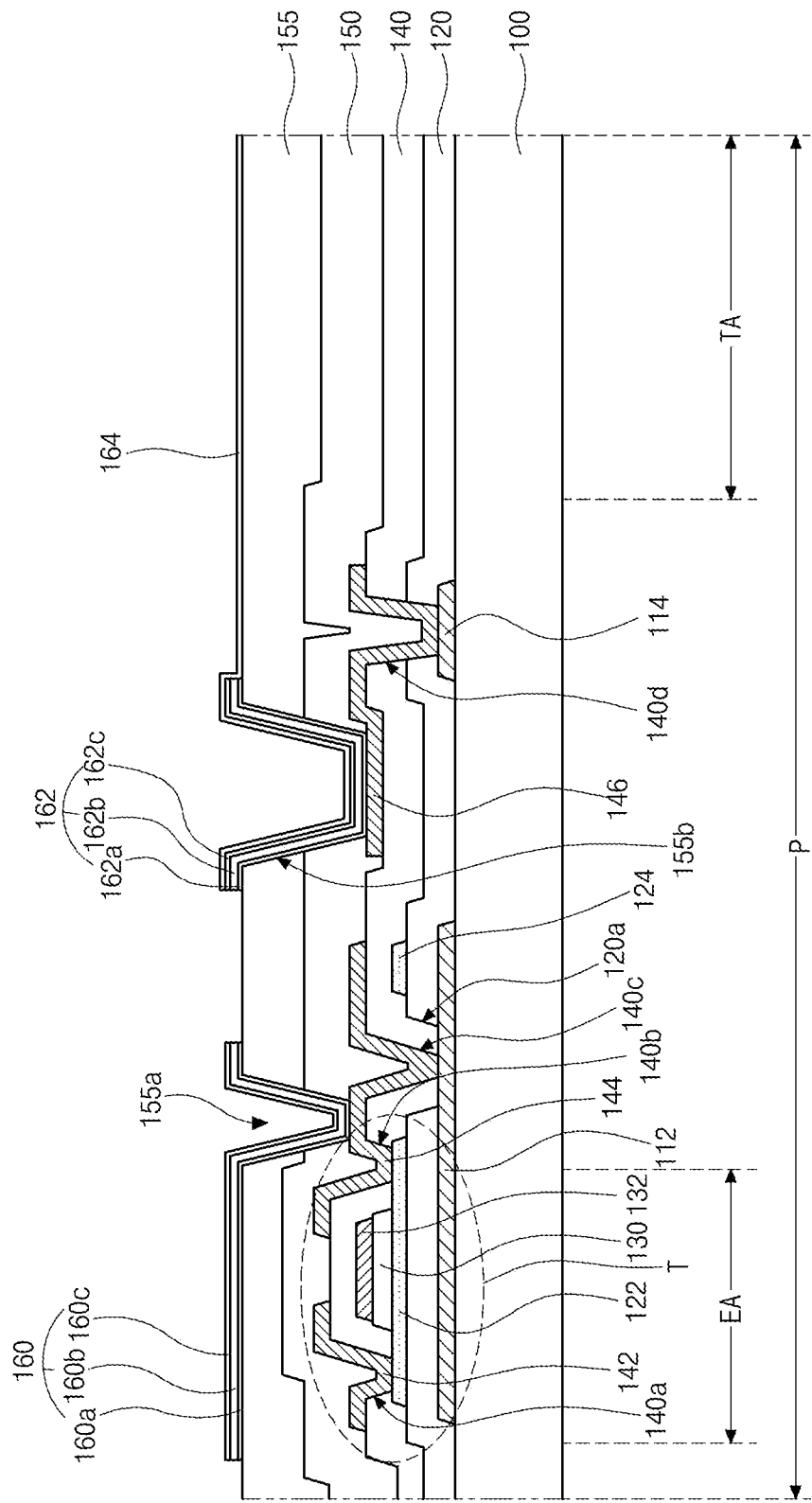

Next, in FIG. 4D, a second connection pattern 164 is formed in the transparent area TA by depositing a transparent conductive material on the first electrode 160 and the first connection pattern 162 and patterning it through a ninth mask process.

The second connection pattern 164 extends into an area between the emission area EA and the transparent area TA and overlaps and covers the first connection pattern 162. The second connection pattern 164 can be formed of a transparent conductive material such as ITO or IZO.

Figure 4E:
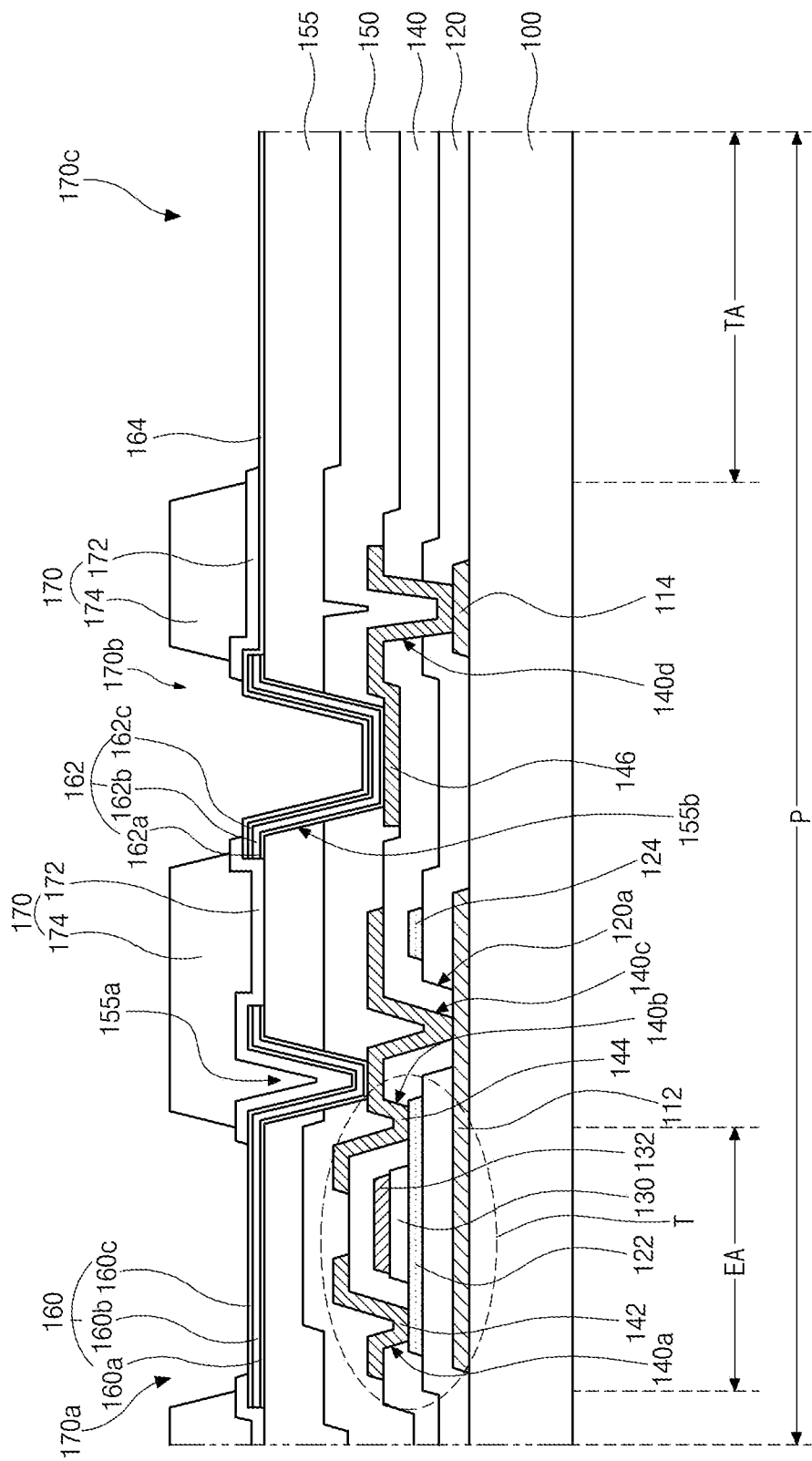

Next, in FIG. 4E, a bank 170 including a first bank 172 of a hydrophilic property and a second bank 174 of a hydrophobic property is formed on the first electrode 160 and the second connection pattern 164 by depositing or applying an insulating material and patterning it through a mask process. At this time, an insulating material having a hydrophilic property is deposited and patterned through a tenth mask process to thereby form the first bank 172, and an organic insulating material having a hydrophobic property is applied and patterned through an eleventh mask process or an organic insulating material having a hydrophilic property is applied, patterned through an eleventh mask process, and subjected to a hydrophobic treatment to thereby form the second bank 174.

Alternatively, the first bank 172 and the second bank 174 can be formed through one mask process. For example, an organic insulating material is formed substantially over the entire surface of the substrate 100, is exposed to light using a halftone mask including a light-transmitting portion, a light-blocking portion and a half light-transmitting portion, and is patterned, thereby forming the first bank 172 of a hydrophilic property and the second bank 174 of a hydrophobic property that are one body and have different widths and thicknesses.

The bank 170 has a first opening 170a corresponding to the emission area EA, a second opening 170c corresponding to the transparent area TA, and an auxiliary contact hole 170b disposed in the area between emission area EA and the transparent area TA.

The first opening 170a exposes a central portion of the first electrode 160, the second opening 170c exposes a central portion of the second connection pattern 164, and the auxiliary contact hole 170b exposes a part of the first connection pattern 162.

Figure 4F:
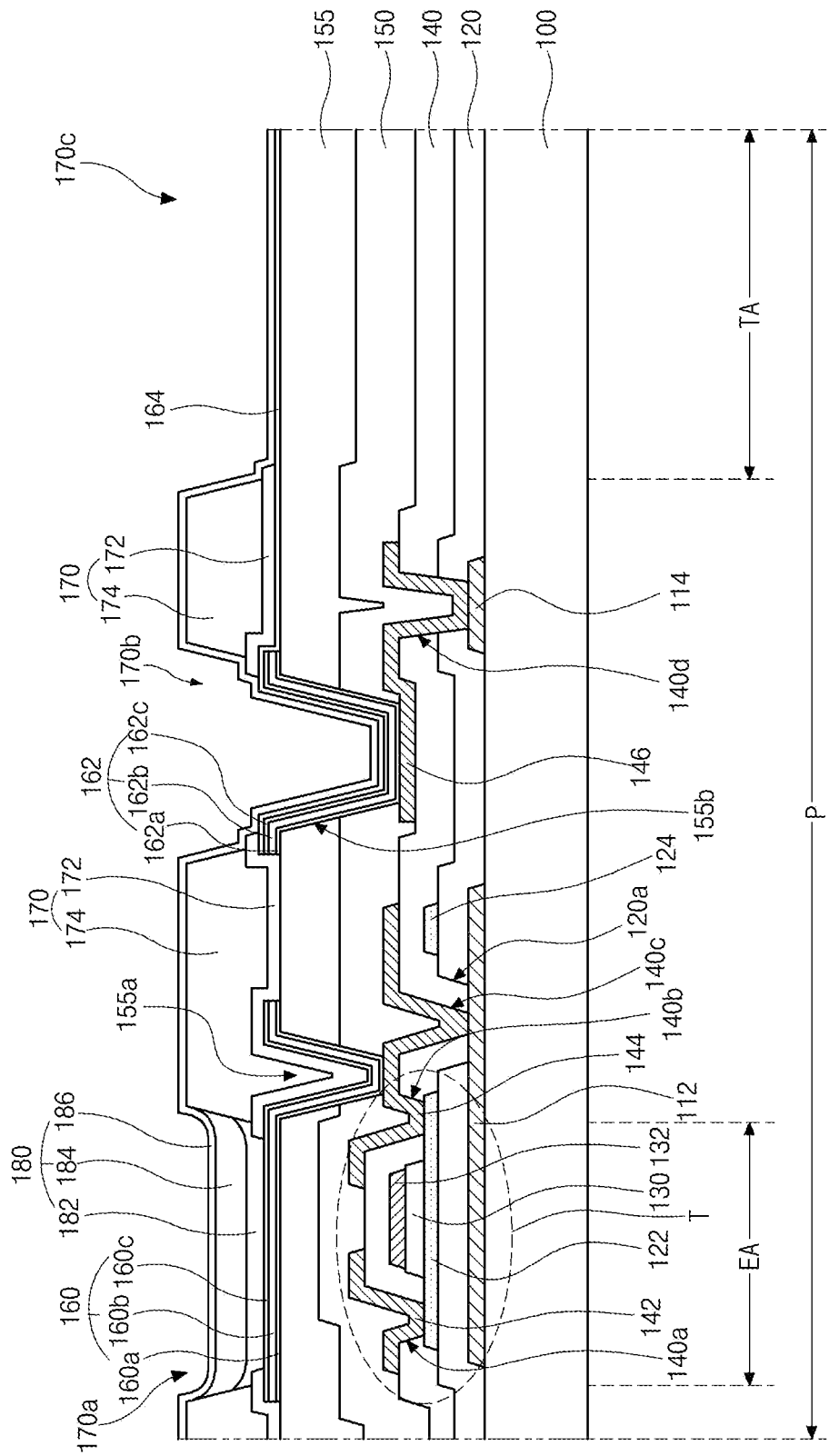

Next, in FIG. 4F, a first charge auxiliary layer 182 is formed on the first electrode 160 exposed by the bank 170 by dropping a first solution and drying it. At least one side surface of the first charge auxiliary layer 182 is enclosed by the second bank 174. When the first solution is dried, a drying speed of a solvent in a region adjacent to the second bank 174 is different from that in other regions, and thus a height of the first charge auxiliary layer 182 in the region adjacent to the second bank 174 rises as it gets closer to the second bank 174. The first charge auxiliary layer 182 can be a hole injecting layer (HIL) and/or a hole transporting layer (HTL).

Then, a light-emitting material layer 184 is formed on the first charge auxiliary layer 182 by dropping a second solution and drying it. At least one side surface of the light-emitting material layer 184 is enclosed by the second bank 174. When the second solution is dried, a drying speed of a solvent in the region adjacent to the second bank 174 is different from that in other regions, and thus a height of the light-emitting material layer 184 in the region adjacent to the second bank 174 rises as it gets closer to the second bank 174.

Next, a second charge auxiliary layer 186 is formed on the light-emitting material layer 184 by depositing an organic material and/or an inorganic material. The second charge auxiliary layer 186 is formed substantially over the entire surface of the substrate 100. Accordingly, the second charge auxiliary layer 186 is also formed on the second bank 174, the first and second connection patterns 162 and 164 in the auxiliary contact hole 170b, and the second connection pattern 164 in the transparent area TA. The second charge auxiliary layer 186 can be an electron injecting layer (EIL) and/or an electron transporting layer (ETL).

The first charge auxiliary layer 182, the light-emitting material layer 184, and the second charge auxiliary layer 186 constitute a light-emitting layer 180.

Figure 4G:
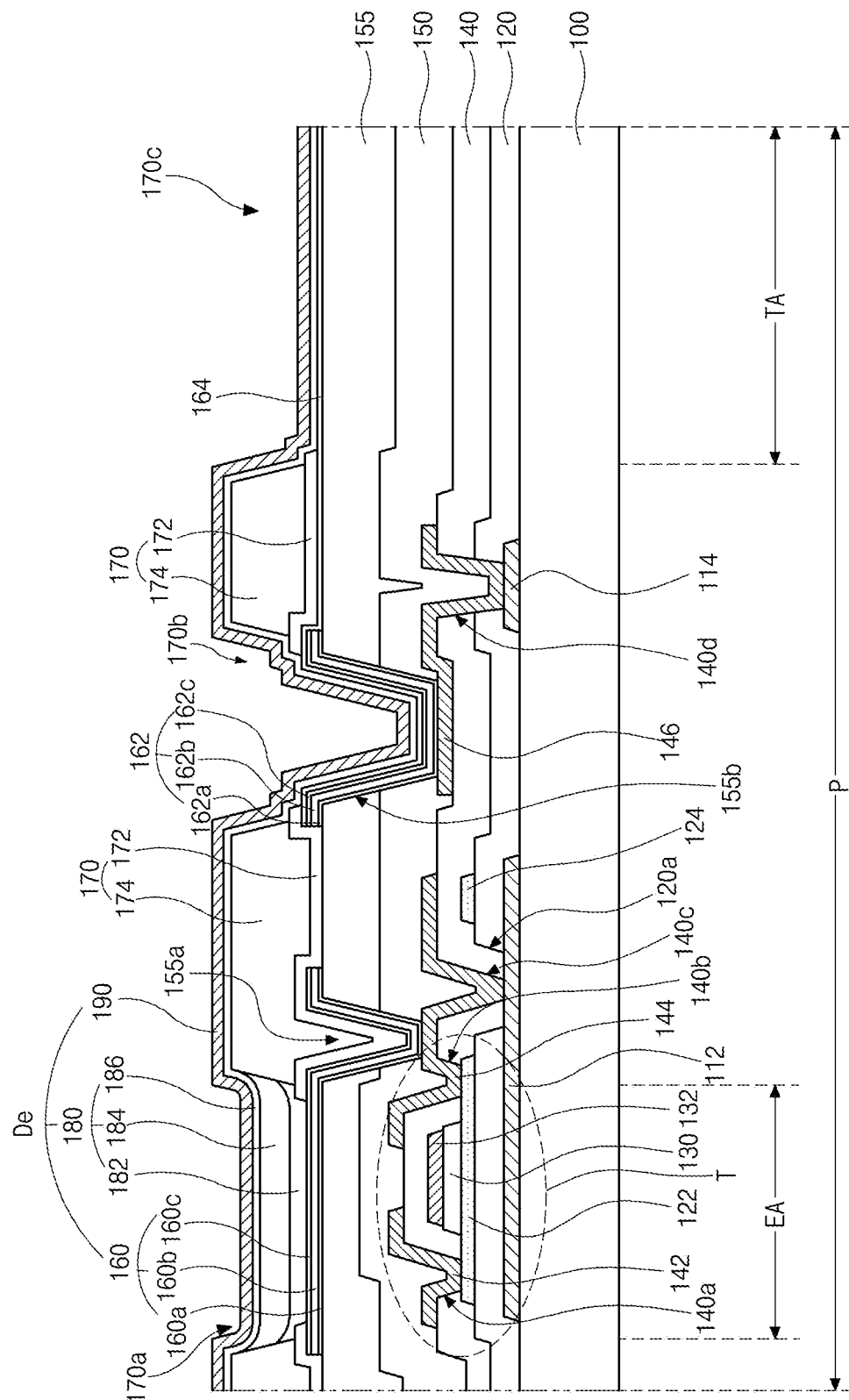

Next, in FIG. 4G, a second electrode 190 is formed on the second charge auxiliary layer 186 by depositing a conductive material such as metal. The second electrode 190 is formed substantially over the entire surface of the substrate 100.

The second electrode 190 is electrically connected to the first connection pattern 162 through the auxiliary contact holes 170b. In addition, the second electrode 190 is electrically connected to the second connection pattern 164 through the second opening 170c.

The first electrode 160, the light-emitting layer 180 and the second electrode 190 constitute a light-emitting diode De. The first electrode 160 can serve as an anode, and the second electrode 190 can serve as a cathode.

As described above, in the transparent display device 1000 according to the first embodiment of the present disclosure, after forming the first electrode 160 and the first connection pattern 162, the second connection pattern 164 is formed in the transparent area TA to be directly connected to the first connection pattern 162, and the second electrode 190 is electrically connected to the first and second auxiliary electrodes 114 and 146 through the first and second connection patterns 162 and 164. Accordingly, the area for electrical connection of the second electrode 190 increases while decreasing the resistance of the second electrode 190, so that the electrical contact property between the second electrode 190 and the first connection pattern 162 can be improved.

Meanwhile, although the second charge auxiliary layer 186 disposed between the second electrode 190 and the first connection pattern 162 may decrease the electrical property, the second electrode 190 is electrically connected to the second connection pattern 164 of the transparent area TA having a relatively large size, and thus the decrease in the electrical contact property between the second electrode 190 and the first connection pattern 162 can be reduced or minimized.

The manufacturing method of the transparent display device 1000 according to the first embodiment of the present disclosure has an advantage that it can be implemented without changing the existing process because only a step for forming the second connection pattern 164 is added.

Figure 5:
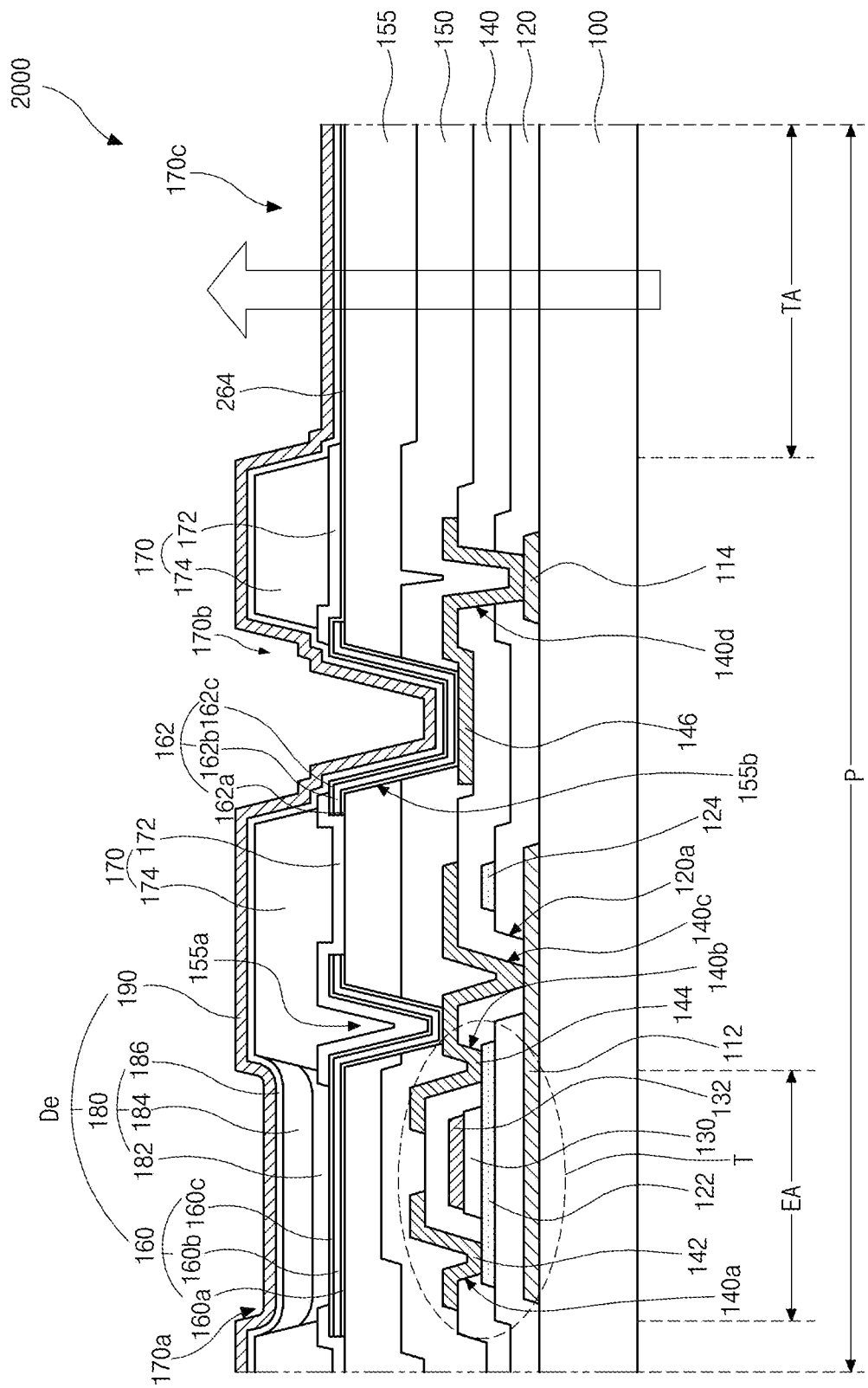
FIG. 5 is a schematic cross-sectional view of a transparent display device according to a second embodiment of the present disclosure.

FIG. 5 is a schematic cross-sectional view of a transparent display device according to a second embodiment of the present disclosure. The transparent display device of the second embodiment has the same configuration as that of the first embodiment except for the second connection pattern. The same parts as those of the first embodiment are designated by the same reference signs, and explanation for the same parts will be shortened or omitted.

As shown in FIG. 5, in the transparent display device 2000 according to the second embodiment of the present disclosure, a first electrode 160, a first connection pattern 162, and a second connection pattern 264 are formed on the overcoat layer 155.

The first electrode 160 is disposed in the emission area EA, the second connection pattern 264 is disposed in the transparent area TA, and the first connection pattern 162 is disposed between the emission area EA and the transparent area TA.

The first electrode 160 and the first connection pattern 162 include a first layer 160a and 162a, a second layer 160b and 162b, and a third layer 160c and 162c. The second layer 160b and 162b is disposed between the first layer 160a and 162a and the third layer 160c and 162c, and the first layer 160a and 162a is disposed between the second layer 160b and 162b and the substrate 100, more particularly, between the second layer 160b and 162b and the overcoat layer 155. The first layer 160a and 162a can be omitted.

The first layer 160a and 162a and the third layer 160c and 162c can be formed of a transparent conductive material having relatively high work function such as ITO or IZO. The second layer 160b and 162b can be formed of a metal material having relatively high reflectance such as aluminum (Al) or silver (Ag). Alternatively, the second layer 160b and 162b can be formed of molybdenum (Mo).

The second connection pattern 264 is directly connected to and in direct contact with the first connection pattern 162. The second connection pattern 264 extends from the third layer 162c of the first connection pattern 162. That is, the second connection pattern 264 can be formed as one body with the third layer 162c of the first connection pattern 162 and can be in contact with side surfaces of the first and second layers 162a and 162b of the first connection pattern 162.

A bank 170 of an insulating material is formed on the first electrode 160 and the first and second connection patterns 162 and 264. The bank 170 overlaps and covers edges of each of the first electrode 160 and the first and second connection patterns 162 and 264.

The bank 170 has a first opening 170a corresponding to the emission area EA, a second opening 170c corresponding to the transparent area TA, and an auxiliary contact hole 170b disposed in the area between emission area EA and the transparent area TA.

The first opening 170a exposes a central portion of the first electrode 160, the second opening 170c exposes a central portion of the second connection pattern 264, and the auxiliary contact hole 170b exposes a part of the first connection pattern 162.

The bank 170 includes a first bank 172 of a hydrophilic property and a second bank 174 of a hydrophobic property on the first bank 172.

A light-emitting layer 180 is formed on the first electrode 160 exposed through the first opening 170a. The light-emitting layer 180 can include a first charge auxiliary layer 182, a light-emitting material layer 184, and a second charge auxiliary layer 186 that are sequentially positioned over the first electrode 160.

Here, each of the first charge auxiliary layer 182 and the light-emitting material layer 184 is formed through a solution process. A height of each of the first charge auxiliary layer 182 and the light-emitting material layer 184 in the region adjacent to the second bank 174 can rise due to a difference in the drying speed according to the location as it gets closer to the second bank 174.

On the other hand, the second charge auxiliary layer 186 is formed substantially over the entire surface of the substrate 100 through a thermal evaporation process. The second charge auxiliary layer 186 contacts top and side surfaces of the second bank 174 and also contacts the first and second connection patterns 162 and 264.

Alternatively, the second charge auxiliary layer 186 can be formed only in the first opening 170a through a solution process.

A second electrode 190 of a conductive material having a relatively low work function is formed on the light-emitting layer 180, the second bank 174 and the first and second connection patterns 162 and 264 substantially over the entire surface of the substrate 100. The second electrode 190 can be formed of aluminum (Al), magnesium (Mg), silver (Ag), or an alloy thereof. At this time, the second electrode 190 has a relatively thin thickness such that light from the light-emitting layer 180 can be transmitted therethrough. Alternatively, the second electrode 190 can be formed of a transparent conductive material such as IGO or IZO.

The second electrode 190 is electrically connected to the first connection pattern 162 through the auxiliary contact hole 170b. In addition, the second electrode 190 is electrically connected to the second connection pattern 264 through the second opening 170c. Accordingly, the area for electrical connection of the second electrode 190 increases, so that the electrical contact property between the second electrode 190 and the first connection pattern 162 can be improved.

The first electrode 160, the light-emitting layer 180 and the second electrode 190 constitute a light-emitting diode De.

A manufacturing method of the transparent display device 2000 according to the second embodiment of the present disclosure will be described in detail with reference to the drawings. At this time, the manufacturing method of the transparent display device 200 according to the second embodiment includes the same steps as those in the first embodiment of FIGS. 4A to 4G except for the steps of forming the first electrode and the first and second connection patterns of FIGS. 4C and 4D, and illustration and description for the same steps will be omitted.

Figure 6A:
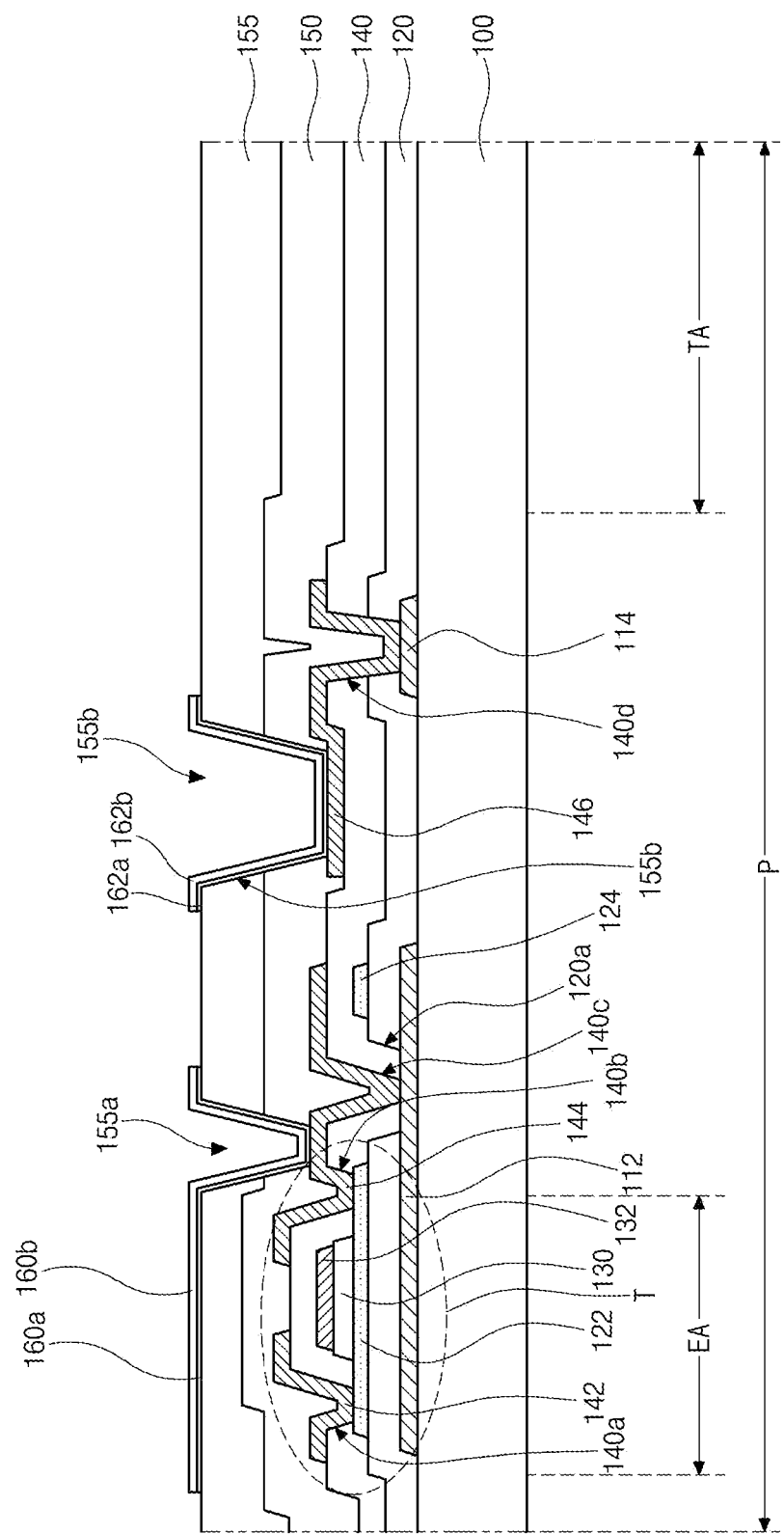
FIGS. 6A and 6B are cross-sectional views schematically illustrating a manufacturing process of a transparent display device according to the second embodiment of the present disclosure.
Figure 6B:
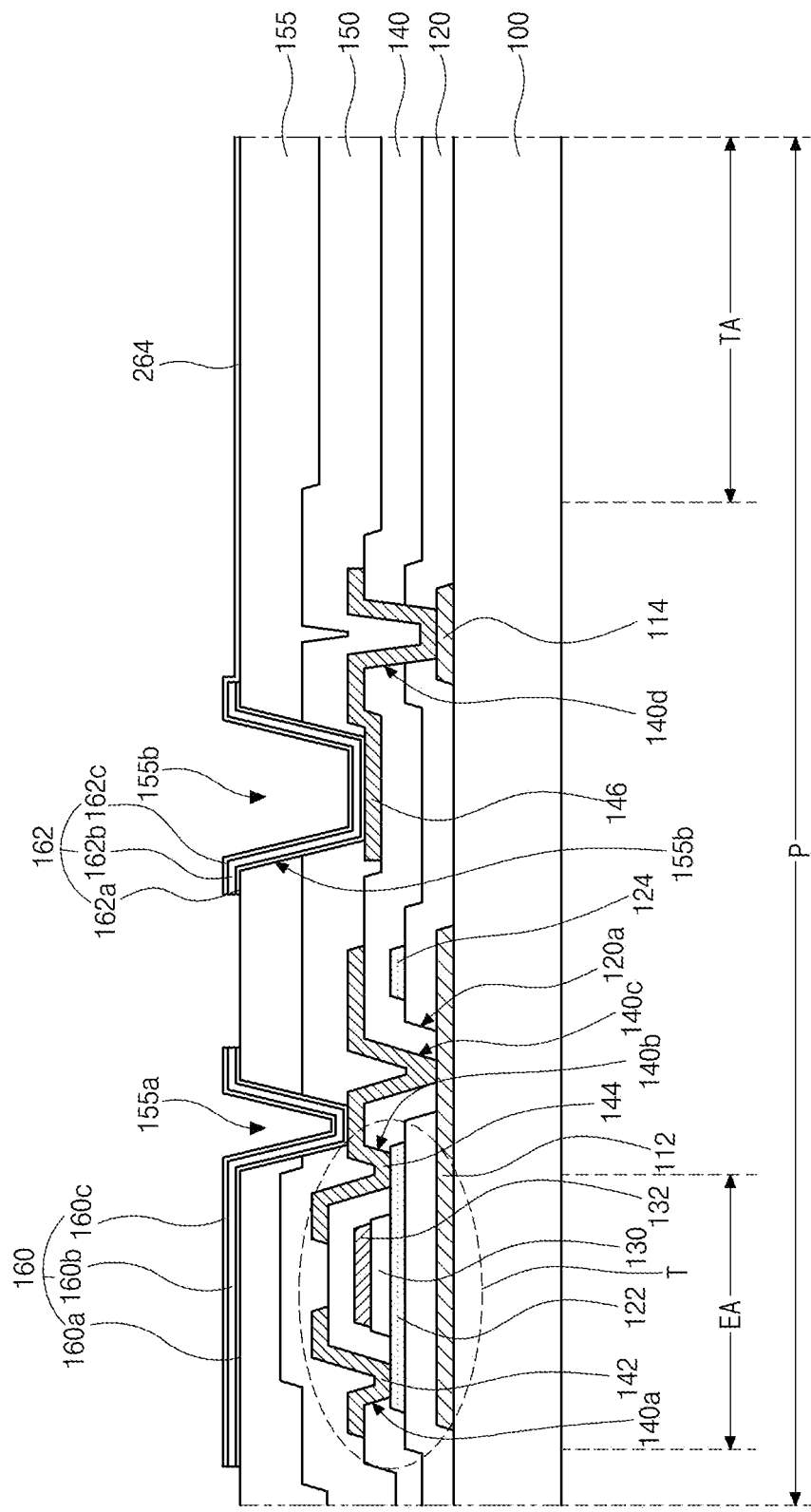

FIGS. 6A and 6B are cross-sectional views schematically illustrating a manufacturing process of a transparent display device according to the second embodiment of the present disclosure and show the steps of forming the first electrode and the first and second connection patterns.

In FIG. 6A, the first layers 160a and 162a and the second layers 160b and 162b of the first electrode 160 and the first connection pattern 162 are formed on the overcoat layer 155 by sequentially depositing first and second conductive layers (not shown) and patterning them through a mask process.

The first layer 160a and the second layer 160b of the first electrode 160 are disposed in the emission area EA, and the first layer 160a is in contact with the drain electrode 144 through the drain contact hole 155a. In addition, the first layer 162a and the second layer 162b of the first connection pattern 162 are disposed between the emission area EA and the transparent area TA, and the first layer 162a is in contact with the second auxiliary electrode 146 through the fifth contact hole 155b.

Next, in FIG. 6B, the third layers 160c and 162c of the first electrode 160 and the first connection pattern 162 and the second connection pattern 264 are formed by depositing a third conductive layer (not shown) on the second layers 160b and 162b of the first electrode 160 and the first connection pattern 162 and patterning it through a mask process.

Accordingly, the first electrode 160 including the first, second and third layers 160a, 160b and 160c is disposed in the emission area EA, the first connection pattern 162 including the first, second and third layers 162a, 162b and 162c is disposed between the emission area EA and the transparent area TA, and the second connection pattern 264 is disposed in the transparent area TA.

Here, the second connection pattern 264 is formed as one body with the third layer 162c of the first connection pattern 162 and is in contact with at least one side surfaces of the first and second layers 162a and 162b of the first connection pattern 162.

Then, as shown in FIGS. 4E to 4G, the bank 170, the light-emitting layer 180 and the second electrode 190 are sequentially formed on the first electrode 160, the first connection pattern 162 and the second connection pattern 264.

As described above, in the manufacturing method of the transparent display device 2000 according to the second embodiment of the present disclosure, the second connection pattern 264 connected to the first connection pattern 162 is formed in the transparent area TA when the third layers 160c and 162c of the first electrode 160 and the first connection pattern 162 are formed, and the second electrode 190 is electrically connected to the first and second connection patterns 162 and 264. Accordingly, the area for electrical connection of the second electrode 190 increases, so that the electrical contact property between the second electrode 190 and the first connection pattern 162 can be improved.

The manufacturing method of the transparent display device 2000 according to the second embodiment of the present disclosure has an advantage that the manufacturing process and material can be decreased as compared with the first embodiment.

Figure 7:
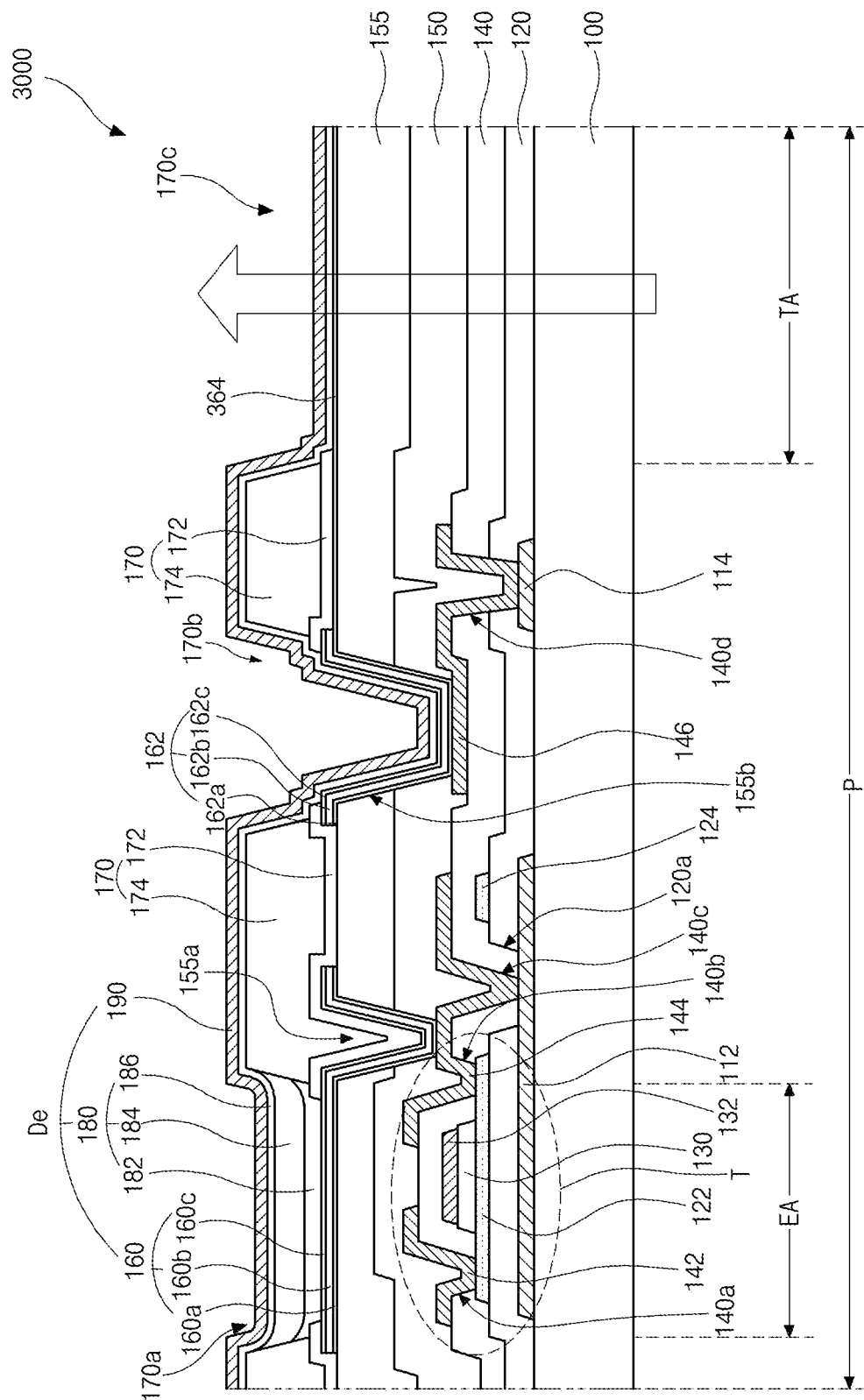
FIG. 7 is a schematic cross-sectional view of a transparent display device according to a third embodiment of the present disclosure.

FIG. 7 is a schematic cross-sectional view of a transparent display device according to a third embodiment of the present disclosure. The transparent display device of the third embodiment has the same configuration as that of the first embodiment except for the second connection pattern. The same parts as those of the first embodiment are designated by the same reference signs, and explanation for the same parts will be shortened or omitted.

As shown in FIG. 7, in the transparent display device 3000 according to the third embodiment of the present disclosure, a first electrode 160, a first connection pattern 162 and a second connection pattern 364 are formed on the overcoat layer 155.

The first electrode 160 is disposed in the emission area EA, the second connection pattern 364 is disposed in the transparent area TA, and the first connection pattern 162 is disposed between the emission area EA and the transparent area TA.

The first electrode 160 and the first connection pattern 162 include a first layer 160a and 162a, a second layer 160b and 162b, and a third layer 160c and 162c. The second layer 160b and 162b is disposed between the first layer 160a and 162a and the third layer 160c and 162c, and the first layer 160a and 162a is disposed between the second layer 160b and 162b and the substrate 100, more particularly, between the second layer 160b and 162b and the overcoat layer 155.

The first layer 160a and 162a and the third layer 160c and 162c can be formed of a transparent conductive material having relatively high work function such as ITO or IZO. The second layer 160b and 162b can be formed of a metal material having relatively high reflectance such as aluminum (Al) or silver (Ag). Alternatively, the second layer 160b and 162b can be formed of molybdenum (Mo).

The second connection pattern 364 is directly connected to and in direct contact with the first connection pattern 162. The second connection pattern 364 extends from the first layer 162a of the first connection pattern 162. That is, the second connection pattern 364 can be formed as one body with the first layer 162a of the first connection pattern 162.

A bank 170 of an insulating material is formed on the first electrode 160 and the first and second connection patterns 162 and 364. The bank 170 overlaps and covers edges of each of the first electrode 160 and the first and second connection patterns 162 and 364.

The bank 170 has a first opening 170a corresponding to the emission area EA, a second opening 170c corresponding to the transparent area TA, and an auxiliary contact hole 170b disposed in the area between emission area EA and the transparent area TA.

The first opening 170a exposes a central portion of the first electrode 160, the second opening 170c exposes a central portion of the second connection pattern 364, and the auxiliary contact hole 170b exposes a part of the first connection pattern 162.

The bank 170 includes a first bank 172 of a hydrophilic property and a second bank 174 of a hydrophobic property on the first bank 172.

A light-emitting layer 180 is formed on the first electrode 160 exposed through the first opening 170a. The light-emitting layer 180 can include a first charge auxiliary layer 182, a light-emitting material layer 184, and a second charge auxiliary layer 186 that are sequentially positioned over the first electrode 160.

Here, each of the first charge auxiliary layer 182 and the light-emitting material layer 184 is formed through a solution process. A height of each of the first charge auxiliary layer 182 and the light-emitting material layer 184 in the region adjacent to the second bank 174 can rise due to a difference in the drying speed according to the location as it gets closer to the second bank 174.

On the other hand, the second charge auxiliary layer 186 is formed substantially over the entire surface of the substrate 100 through a thermal evaporation process. The second charge auxiliary layer 186 contacts top and side surfaces of the second bank 174 and also contacts the first and second connection patterns 162 and 364.

Alternatively, the second charge auxiliary layer 186 can be formed only in the first opening 170a through a solution process.

A second electrode 190 of a conductive material having a relatively low work function is formed on the light-emitting layer 180, the second bank 174 and the first and second connection patterns 162 and 364 substantially over the entire surface of the substrate 100. The second electrode 190 can be formed of aluminum (Al), magnesium (Mg), silver (Ag), or an alloy thereof. At this time, the second electrode 190 has a relatively thin thickness such that light from the light-emitting layer 180 can be transmitted therethrough. Alternatively, the second electrode 190 can be formed of a transparent conductive material such as IGO or IZO.

The second electrode 190 is electrically connected to the first connection pattern 162 through the auxiliary contact hole 170b. In addition, the second electrode 190 is electrically connected to the second connection pattern 364 through the second opening 170c. Accordingly, the area for electrical connection of the second electrode 190 increases, so that the electrical contact property between the second electrode 190 and the first connection pattern 162 can be improved.

The first electrode 160, the light-emitting layer 180 and the second electrode 190 constitute a light-emitting diode De.

A manufacturing method of the transparent display device 3000 according to the third embodiment of the present disclosure will be described in detail with reference to the drawings. At this time, the manufacturing method of the transparent display device 3000 according to the third embodiment includes the same steps as those in the first embodiment of FIGS. 4A to 4G except for the steps of forming the first electrode and the first and second connection patterns of FIGS. 4C and 4D, and illustration and description for the same steps will be omitted.

Figure 8A:
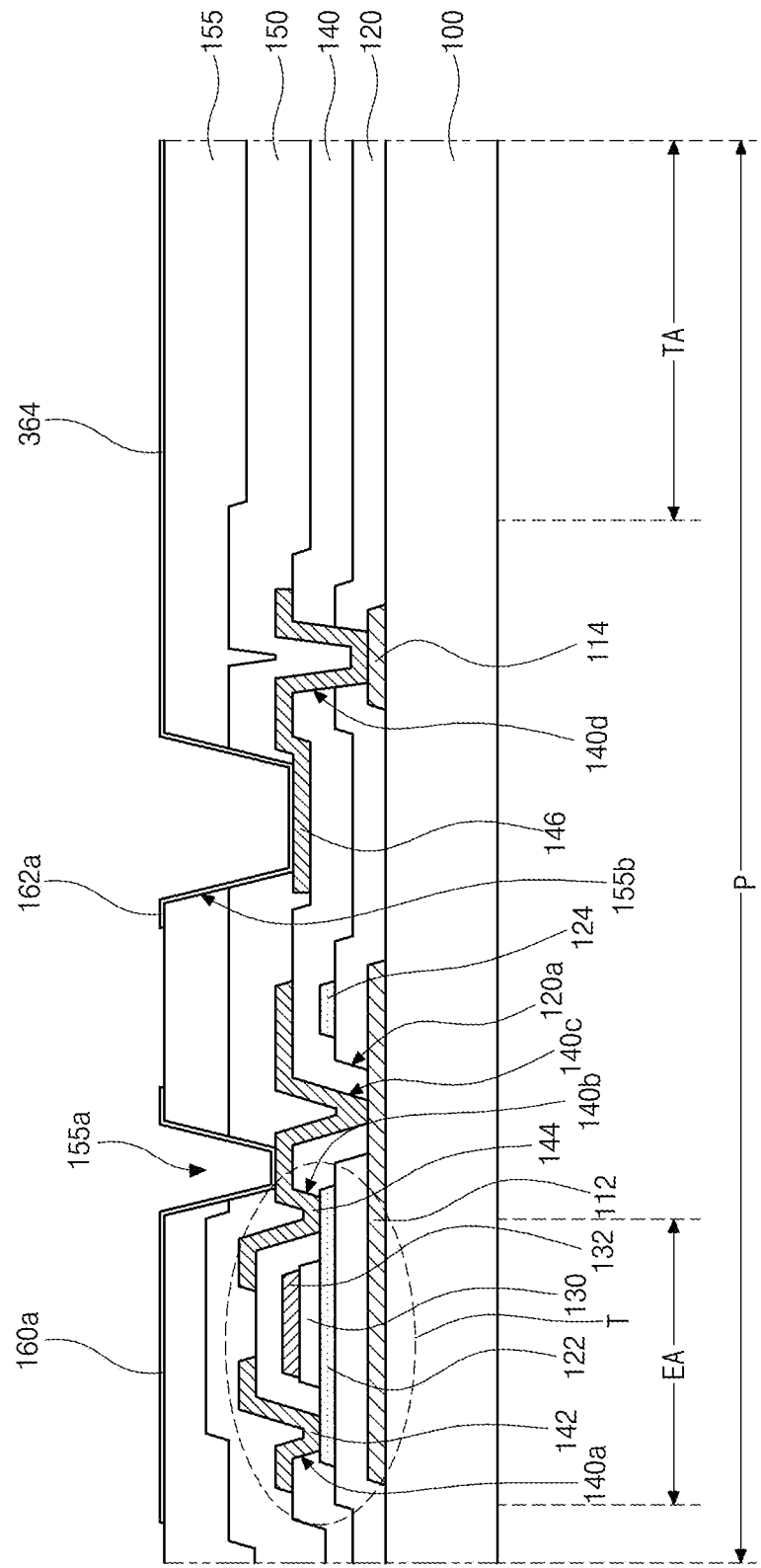
FIGS. 8A and 8B are cross-sectional views schematically illustrating a manufacturing process of a transparent display device according to the third embodiment of the present disclosure.
Figure 8B:
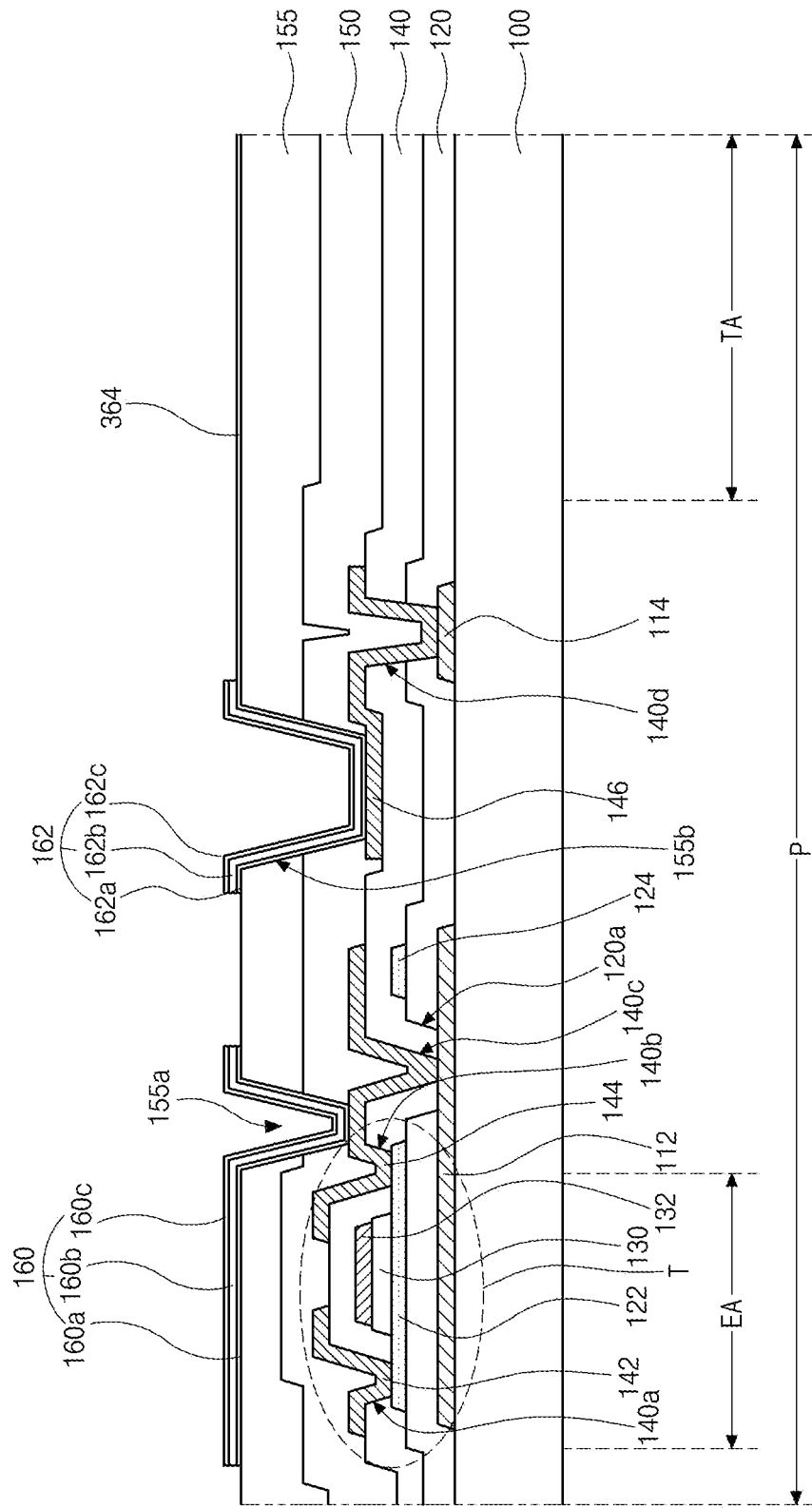

FIGS. 8A and 8B are cross-sectional views schematically illustrating a manufacturing process of a transparent display device according to the third embodiment of the present disclosure and show the steps of forming the first electrode and the first and second connection patterns.

In FIG. 8A, the first layers 160a and 162a of the first electrode 160 and the first connection pattern 162 and the second connection pattern 364 are formed on the overcoat layer 155 by depositing a first conductive layer (not shown) and patterning it through a mask process.

The first layer 160a of the first electrode 160 is disposed in the emission area EA and is in contact with the drain electrode 144 through the drain contact hole 155a. In addition, the first layer 162a of the first connection pattern 162 is disposed between the emission area EA and the transparent area TA and is in contact with the second auxiliary electrode 146 through the fifth contact hole 155b.

Meanwhile, the second connection pattern 364 is disposed in the transparent area TA and is connected to the first layer 162a of the first connection pattern 162 to form one body.

Next, in FIG. 8B, the second layers 160b and 162b and the third layers 160c and 162c of the first electrode 160 and the first connection pattern 162 are formed on the first layers 160a and 162a of the first electrode 160 and the first connection pattern 162 by sequentially depositing second and third conductive layers (not shown) and patterning them through a mask process.

Accordingly, the first electrode 160 including the first, second and third layers 160a, 160b and 160c is disposed in the emission area EA, and the first connection pattern 162 including the first, second and third layers 162a, 162b and 162c is disposed between the emission area EA and the transparent area TA.

Then, as shown in FIGS. 4E to 4G, the bank 170, the light-emitting layer 180 and the second electrode 190 are sequentially formed on the first electrode 160, the first connection pattern 162 and the second connection pattern 364.

As described above, in the manufacturing method of the transparent display device 3000 according to the third embodiment of the present disclosure, the second connection pattern 364 connected to the first connection pattern 162 is formed in the transparent area TA when the first layers 160a and 162a of the first electrode 160 and the first connection pattern 162 are formed, and the second electrode 190 is electrically connected to the first and second connection patterns 162 and 364. Accordingly, the area for electrical connection of the second electrode 190 increases, so that the electrical contact property between the second electrode 190 and the first connection pattern 162 can be improved.

The manufacturing method of the transparent display device 3000 according to the third embodiment of the present disclosure has an advantage that the manufacturing process and material can be decreased as compared with the first embodiment.

Meanwhile, in the third embodiment, the first electrode 160, the first connection pattern 162 and the second connection pattern 364 are formed through three mask processes, but is not limited thereto.

Alternatively, the first electrode 160, the first connection pattern 162 and the second connection pattern 364 can be formed through one mask process using a halftone mask that includes a light-transmitting portion, a light-blocking portion and a half light-transmitting portion. At this time, the half light-transmitting portion can correspond to the second connection pattern 364.

Figure 9:
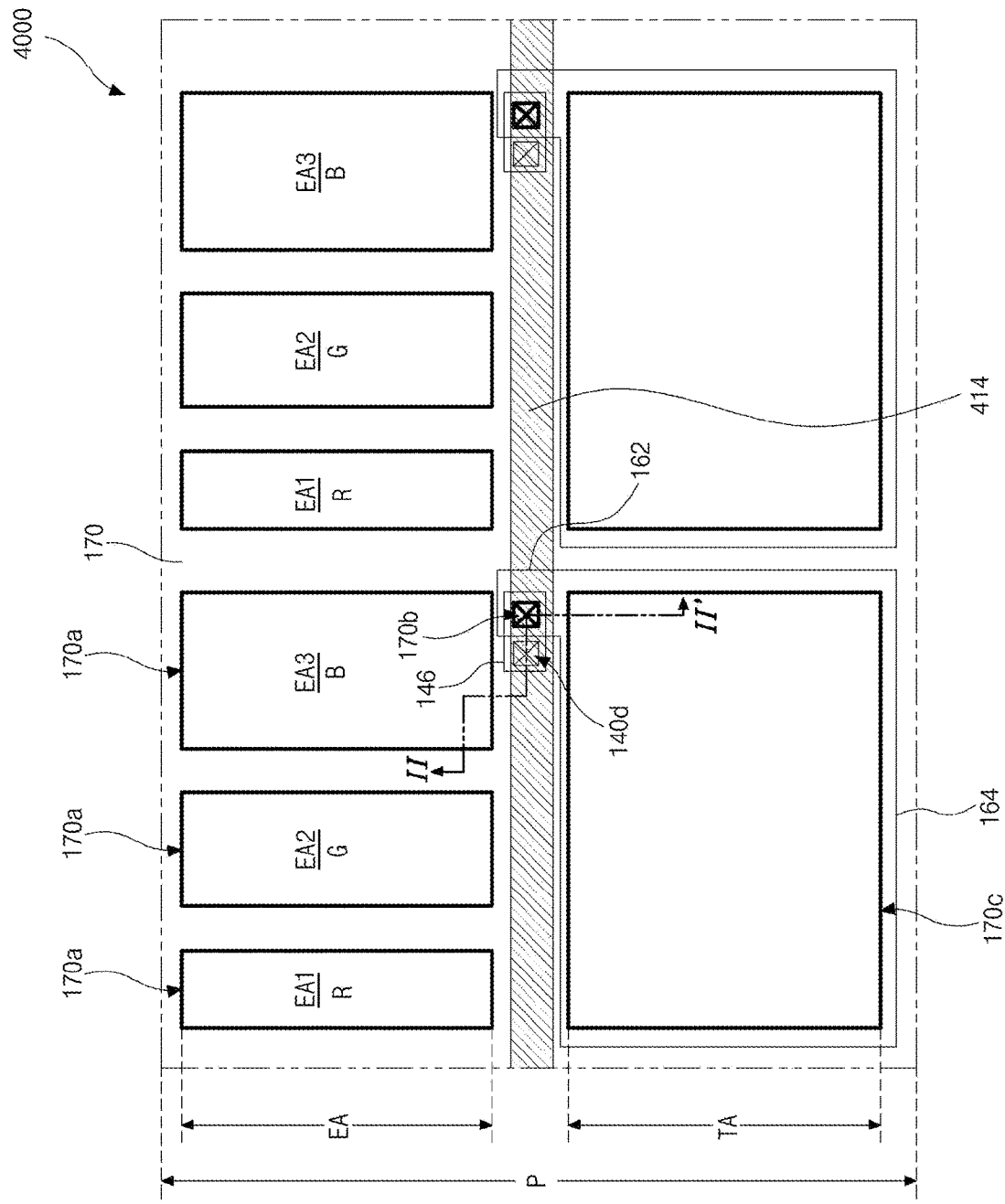
FIG. 9 is a schematic plan view of a transparent display device according to a fourth embodiment of the present disclosure.

FIG. 9 is a schematic plan view of a transparent display device according to a fourth embodiment of the present disclosure and mainly shows a bank configuration. The transparent display device of the fourth embodiment has substantially the same configuration as that of the first embodiment except for the arrangement of the first auxiliary electrode. The same parts as those of the first embodiment are designated by the same reference signs, and explanation for the same parts will be shortened or omitted.

As shown in FIG. 9, in the transparent display device 4000 according to the fourth embodiment of the present disclosure, one pixel P includes an emission area EA and a transparent area TA. The emission area EA includes first, second and third emission areas EA1, EA2 and EA3 corresponding to red, green and blue sub-pixels, respectively.

The emission area EA and the transparent area TA are arranged along a first direction (e.g., vertical direction), and the first, second and third emission areas EA1, EA2 and EA3 are arranged along a second direction (e.g., horizontal direction) perpendicular to the first direction. Here, the first, second and third emission areas EA1, EA2 and EA3 can have different sizes. In this case, the first, second and third emission areas EA1, EA2 and EA3 can have the same length along the first direction and different widths along the second direction, but is not limited thereto.

A bank 170 is formed between the first, second and third emission areas EA1, EA2 and EA3 and between the emission area EA and the transparent area TA. The bank 170 has a first opening 170a corresponding to each of the first, second and third emission areas EA1, EA2 and EA3 and a second opening 170c corresponding to the transparent area TA.

First and second auxiliary electrodes 414 and 146 and first and second connection patterns 162 and 164 are formed under the bank 170.

The first auxiliary electrode 414 can be provided as a line shape extending along the second direction and can be disposed between the emission area EA and the transparent area TA arranged along the first direction.

The second auxiliary electrode 146 is disposed between the emission area EA and the transparent area TA and partially overlaps the first auxiliary electrode 414. The second auxiliary electrode 146 is connected to the first auxiliary electrode 414 through a contact hole 140d.

In addition, the first connection pattern 162 is disposed between the emission area EA and the transparent area TA and partially overlaps the second auxiliary electrode 146. The bank 170 has an auxiliary contact hole 170b corresponding to the first connection pattern 162. The first connection pattern 162 is connected to the second auxiliary electrode 146 through a contact hole (not shown) under the auxiliary contact hole 170b.

The second connection pattern 164 is disposed to correspond to the transparent area TA and is exposed through the second opening 170c. The second connection pattern 164 is in direct contact with the first connection pattern 162. The second connection pattern 164 can overlap and cover the first connection pattern 162. Alternatively, the second connection pattern 164 can extend from the first connection pattern 162.

A cross-sectional structure of the transparent display device 4000 according to the fourth embodiment of the present disclosure will be described in detail with reference to FIG. 10.

Figure 10:
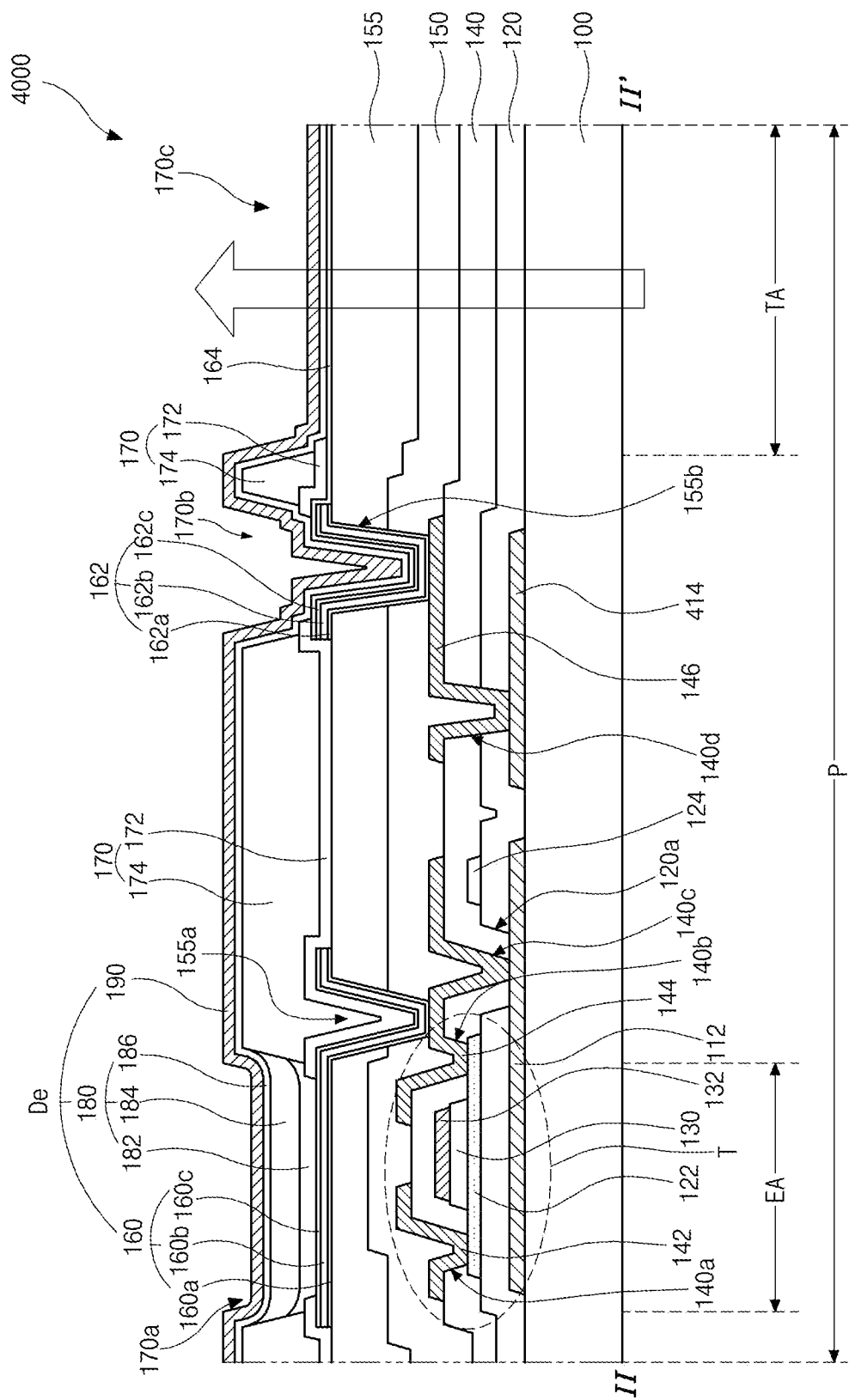
FIG. 10 is a schematic cross-sectional view of the transparent display device according to the fourth embodiment of the present disclosure and corresponds to the line II-II' of FIG. 9.

FIG. 10 is a schematic cross-sectional view of the transparent display device according to the fourth embodiment of the present disclosure and corresponds to the line II-IF of FIG. 9. The transparent display device of the fourth embodiment has substantially the same configuration as that of the first embodiment shown in FIG. 3 except for the contact structure between the emission area and the transparent area. The same parts as those of the first embodiment are designated by the same reference signs, and explanation for the same parts will be shortened or omitted.

As shown in FIG. 10, in the transparent display device 4000 according to the fourth embodiment of the present disclosure, a first auxiliary electrode 414 is formed on the substrate 100 between the emission area EA and the transparent area TA, and a second auxiliary electrode 146 and a first connection pattern 162 are sequentially formed over the first auxiliary electrode 414.

The second auxiliary electrode 146 is in contact with the first auxiliary electrode 414 through a fourth contact hole 140d, and the first connection pattern 162 is in contact with the second auxiliary electrode 146 through a fifth contact hole 155b.

Here, the fifth contact hole 155b can be disposed right over the first auxiliary electrode 414, and the first connection pattern 162 can overlap the first auxiliary electrode 414.

At this time, the fifth contact hole 155b can be disposed on a right side of the fourth contact hole 140d in FIG. 10, and the fifth contact hole 155b can be disposed between the fourth contact hole 140d and the transparent area TA. However, the present disclosure is not limited thereto.

Alternatively, as shown in the first embodiment of FIG. 3, the fourth contact hole 140d can be disposed on a right side of the fifth contact hole 155b, and the fourth contact hole 140d can be disposed between the fifth contact hole 155b and the transparent area TA.

Figure 11:
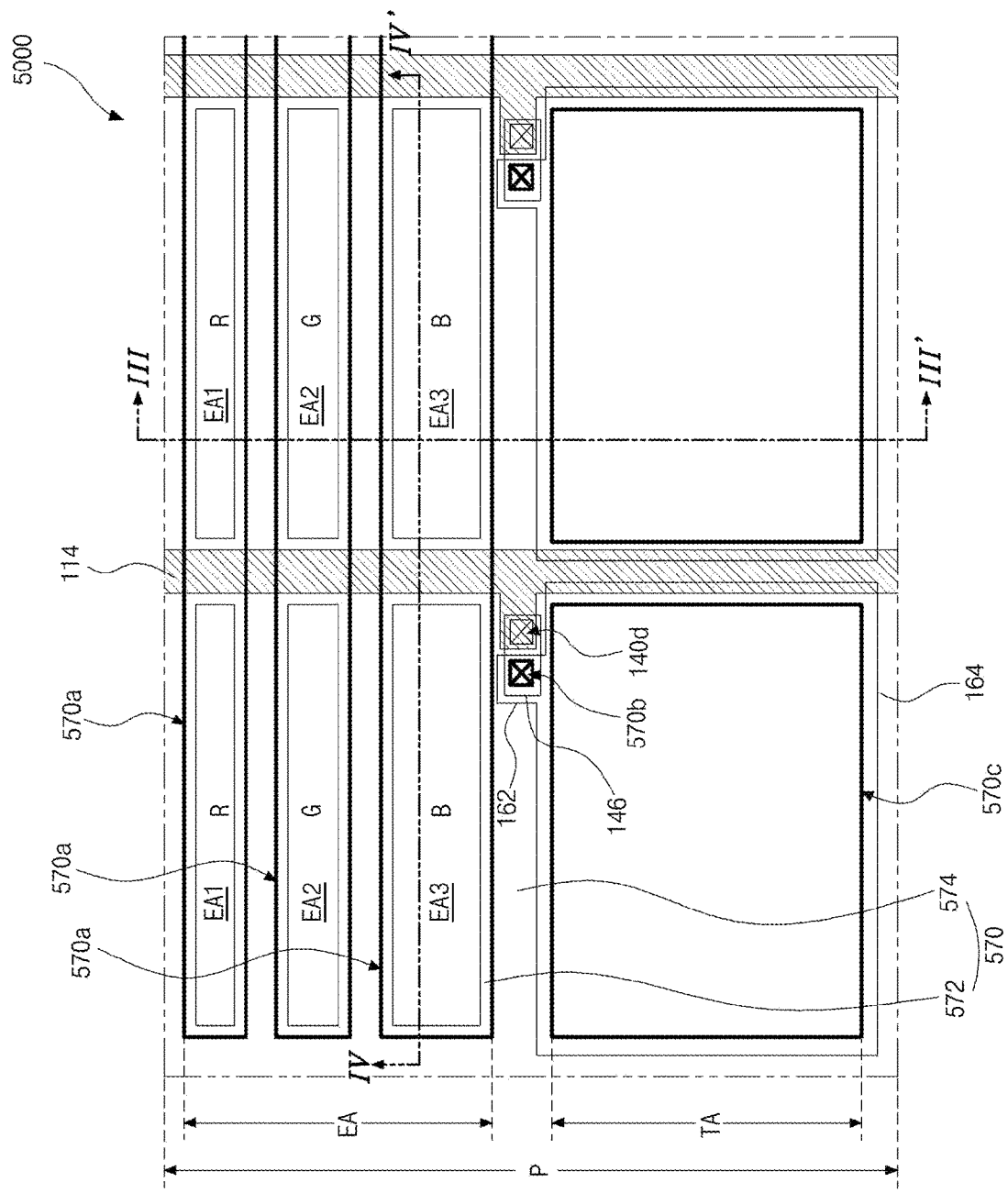
FIG. 11 is a schematic plan view of a transparent display device according to a fifth embodiment of the present disclosure.

FIG. 11 is a schematic plan view of a transparent display device according to a fifth embodiment of the present disclosure and mainly shows a bank configuration. The transparent display device of the fifth embodiment has substantially the same configuration as that of the first embodiment except for the arrangement of the emission area and the bank. The same parts as those of the first embodiment are designated by the same reference signs, and explanation for the same parts will be shortened or omitted.

As shown in FIG. 11, in the transparent display device 5000 according to the fifth embodiment of the present disclosure, one pixel P includes an emission area EA and a transparent area TA. The emission area EA includes first, second and third emission areas EA1, EA2 and EA3 corresponding to red, green and blue sub-pixels, respectively.

The emission area EA and the transparent area TA are arranged along a first direction (e.g., vertical direction), and the first, second and third emission areas EA1, EA2 and EA3 are also arranged along the first direction. Here, the first, second and third emission areas EA1, EA2 and EA3 can have different sizes. In this case, the first, second and third emission areas EA1, EA2 and EA3 can have the same length along a second direction (e.g., horizontal direction) perpendicular to the first direction and different widths along the first direction, but is not limited thereto.

A bank 570 is formed between the first, second and third emission areas EA1, EA2 and EA3 and between the emission area EA and the transparent area TA. The bank 570 has a first opening 570a corresponding to each of the first, second and third emission areas EA1, EA2 and EA3 and a second opening 570c corresponding to the transparent area TA.

In addition, the bank 570 has an auxiliary contact hole 570b between the emission area EA and the transparent area TA.

The bank 570 includes a first bank 572 of a hydrophilic property and a second bank 574 of a hydrophobic property. The first bank 572 is disposed between the first, second and third emission areas EA1, EA2 and EA3 adjacent to each other along the first and second directions. Here, first bank 572 can be omitted between the first, second and third emission areas EA1, EA2 and EA3 adjacent to each other along the first direction.

The second bank 574 is disposed between the first, second and third emission areas EA1, EA2 and EA3 adjacent to each other along the first direction. Here, the first opening 570a, which is an opening of the second bank 574, can be provided to correspond to the emission areas EA1, EA2 and EA3 of each sub-pixel row including the same color sub-pixels arranged along the second direction.

First and second auxiliary electrodes 114 and 146 and first and second connection patterns 162 and 164 are formed under the bank 570.

The first auxiliary electrode 114 can be provided as a line shape extending along the first direction, and one first auxiliary electrode 114 can be disposed between pixels P adjacent to each other along the second direction.

The second auxiliary electrode 146 is disposed between the emission area EA and the transparent area TA and partially overlaps the first auxiliary electrode 114. The second auxiliary electrode 146 is connected to the first auxiliary electrode 114 through a contact hole 140d.

In addition, the first connection pattern 162 is disposed between the emission area EA and the transparent area TA and partially overlaps the second auxiliary electrode 146. The first connection pattern 162 is connected to the second auxiliary electrode 146 through a contact hole (not shown) under the auxiliary contact hole 570b.

The second connection pattern 164 is disposed to correspond to the transparent area TA and is exposed through the second opening 570c.

Meanwhile, the auxiliary contact hole 570b of the bank 570 is disposed to correspond to the first connection pattern 162.

In the transparent display device 5000 according to the fifth embodiment of the present disclosure, the light-emitting layers of the same color sub-pixels are connected to each other and formed as one body due to the first opening 570a, thereby reducing or minimizing the deviation in the dropping amounts between nozzles and uniformly forming the thicknesses of the light-emitting layers of the sub-pixels. Therefore, the mura is prevented, thereby effectively preventing the image quality of the display device from being lowered.

A cross-sectional structure of the transparent display device 5000 according to the fifth embodiment of the present disclosure will be described in detail with reference to FIGS. 12 and 13.

Figure 12:
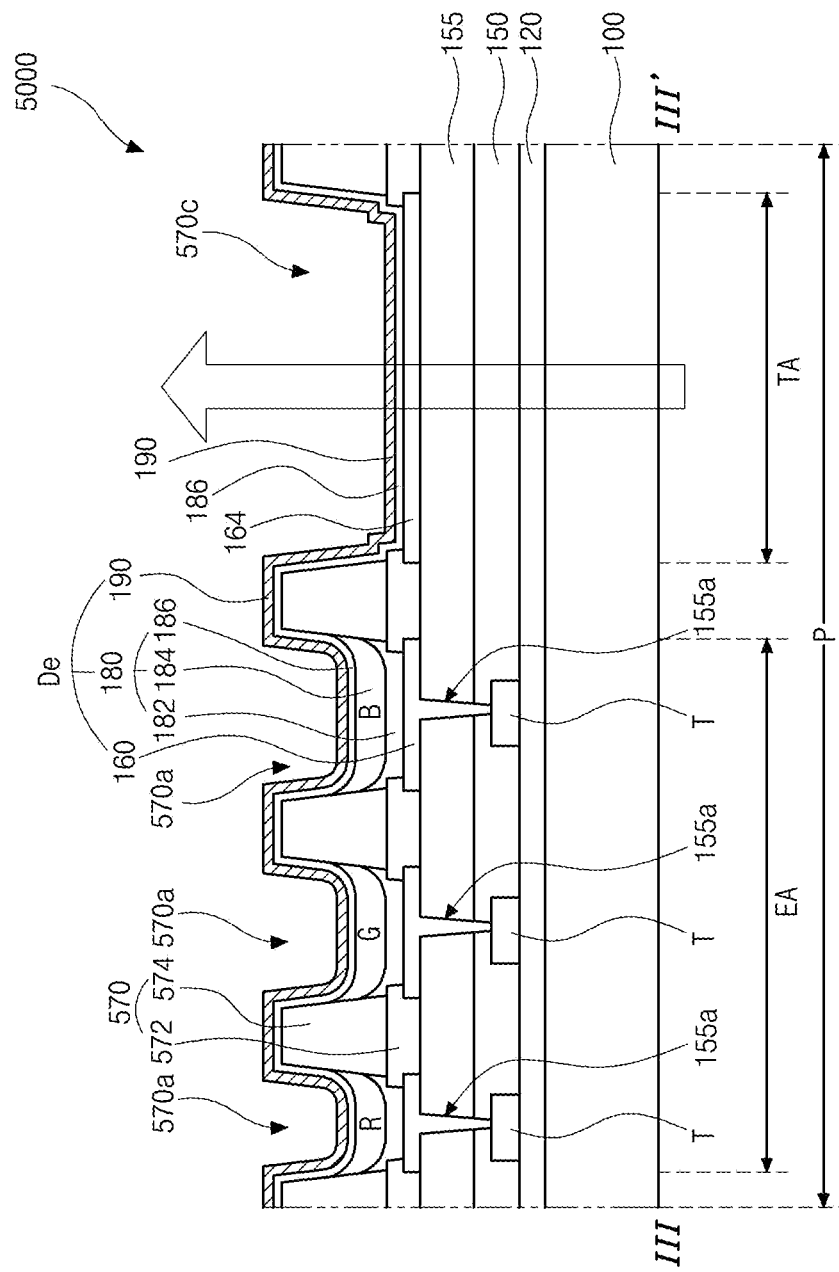
FIG. 12 is a cross-sectional view corresponding to the line III-III' of FIG. 11 according to an embodiment of the present disclosure.
Figure 13:
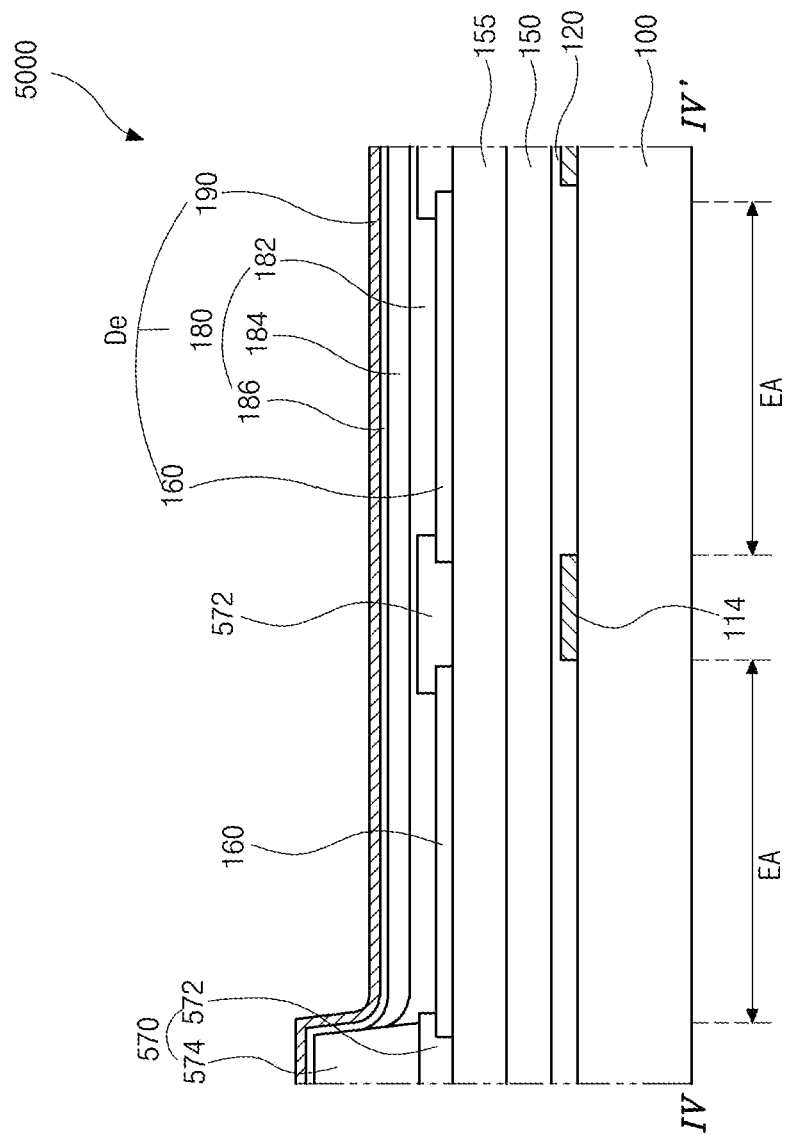
FIG. 13 is a cross-sectional view corresponding to the line IV-IV' of FIG. 11 according to an embodiment of the present disclosure.

FIG. 12 is a cross-sectional view corresponding to the line III-III' of FIG. 11, and FIG. 13 is a cross-sectional view corresponding to the line IV-IV' of FIG. 11.

As shown in FIGS. 12 and 13, in the transparent display device 5000 according to the fifth embodiment of the present disclosure, the pixel P including the emission area EA and the transparent area TA is defined on the substrate 100, and the first auxiliary electrode 114 is formed on the substrate 100 between emission areas EA adjacent to each other along the second direction. The buffer layer 120 is formed on the first auxiliary electrode 114 substantially on the entire surface of the substrate 100, and the thin film transistor T is formed on the buffer layer 120 to correspond to the emission area EA of each sub-pixel.

Then, the passivation layer 150 and the overcoat layer 155 are sequentially formed substantially over the entire surface of the substrate 100, and the first electrode 160 is formed on the overcoat layer 155 in the emission area EA of each sub-pixel.

The overcoat layer 155 has the drain contact hole 155a exposing a part of the thin film transistor T, that is, the drain electrode of the thin film transistor T together with the passivation layer 150, and the first electrode 160 contacts the drain electrode of the thin film transistor T through the drain contact hole 155a.

Meanwhile, although not shown in the figures, the first connection pattern 162 of FIG. 11 is formed on the overcoat layer 155 between the emission area EA and the transparent area TA and formed of the same material as the first electrode 160.

In addition, the second connection pattern 164 is formed on the overcoat layer 155 in the transparent area TA and formed of a transparent conductive material.

Next, the bank 570 is formed on the first electrode 160 and the first and second connection patterns 162 and 164. The bank 570 includes the first bank 572 of a hydrophilic property and the second bank 574 of a hydrophobic property. The bank 570 has the first opening 570a corresponding to the emission area EA and the second opening 570c corresponding to the transparent area TA.

At this time, the first bank 572 is formed between adjacent same color sub-pixels and between adjacent different color sub-pixels. On the other hand, the second bank 574 is formed only between the adjacent different color sub-pixels and exposes the first bank 572 disposed between the adjacent same color sub-pixels.

The light-emitting layer 180 is formed on the first electrode 160 exposed through the first opening 570a. The light-emitting layer 180 can include the first charge auxiliary layer 182, the light-emitting material layer 184, and the second charge auxiliary layer 186 that are sequentially positioned over the first electrode 160. The second charge auxiliary layer 186 is formed substantially over the entire surface of the substrate 100, so that the second charge auxiliary layer 186 can be formed on the second bank 574 and the first and second connection patterns 162 and 164.

Here, the light-emitting layer 180 is also formed on the first bank 572 exposed between the adjacent same color sub-pixels, and the light-emitting layer 180 on the first bank 572 is connected to the light-emitting layer 180 on the first electrode 160 adjacent thereto, thereby forming one body.

At least the first charge auxiliary layer 182 and the light-emitting material layer 184 of the light-emitting layer 180 are formed through a solution process. Here, solutions dropped through different nozzles corresponding to the same color sub-pixel row are connected to each other, and the solutions are dried, thereby forming each of the first charge auxiliary layer 182 and the light-emitting material layer 184. Accordingly, the deviation in the dropping amounts between the nozzles is reduced or minimized, so that the thicknesses of thin films formed in respective sub-pixels can be uniformly formed.

Meanwhile, the second charge auxiliary layer 186 is formed through a thermal evaporation process. Alternatively, the second charge auxiliary layer 186 can be formed only in the first opening 570a through the solution process.

Next, the second electrode 190 is formed on the light-emitting layer 180. The first electrode 160, the light-emitting layer 180 and the second electrode 190 constitute a light-emitting diode De.

Here, the second electrode 190 is formed substantially over the entire surface of the substrate 100. Accordingly, the second electrode 190 is also formed on the second bank 574 and the first and second connection patterns 162 and 164 and is electrically connected to the first and second connection patterns 162 and 164.

Figure 14:
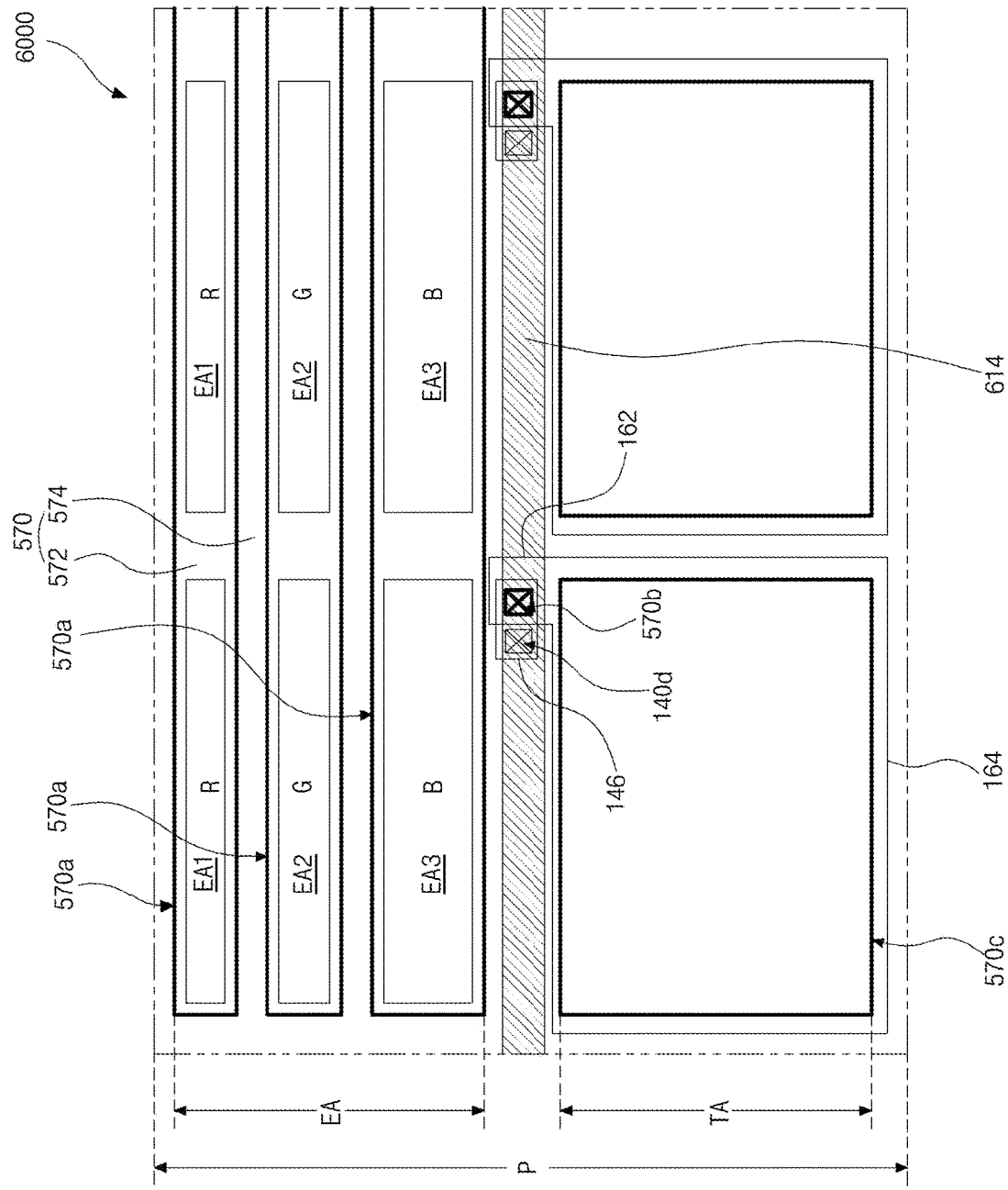
FIG. 14 is a schematic plan view of a transparent display device according to a sixth embodiment of the present disclosure.

FIG. 14 is a schematic plan view of a transparent display device according to a sixth embodiment of the present disclosure and mainly shows a bank configuration. The transparent display device of the sixth embodiment has substantially the same configuration as that of the fifth embodiment except for the arrangement of the first auxiliary electrode. The same parts as those of the fifth embodiment are designated by the same reference signs, and explanation for the same parts will be shortened or omitted.

As shown in FIG. 14, in the transparent display device 6000 according to the sixth embodiment of the present disclosure, one pixel P includes an emission area EA and a transparent area TA. The emission area EA includes first, second and third emission areas EA1, EA2 and EA3 corresponding to red, green and blue sub-pixels, respectively.

The emission area EA and the transparent area TA are arranged along the first direction (e.g., vertical direction), and the first, second and third emission areas EA1, EA2 and EA3 are also arranged along the first direction.

A first auxiliary electrode 614 can be provided as a line shape extending along the second direction (e.g., horizontal direction). The first auxiliary electrode 614 can be disposed between the emission area EA and the transparent area TA arranged along the first direction.

The transparent display device 6000 according to the sixth embodiment of the present disclosure can have the cross-sectional structures corresponding to those of FIGS. 12 and 13.

In the present disclosure, since each pixel includes the emission area and the transparent area, the surrounding environment information such as backgrounds can be shown through the transparent areas while displaying the image information through the emission areas.

In addition, the emission areas of the red, green and blue sub-pixels are configured to have the different sizes, the lifetimes of the light-emitting diodes provided at respective sub-pixels can be uniform, thereby improving the lifetime of the transparent display device.

Further, by forming at least a part of the light-emitting layer through the solution process, the fine metal mask can be omitted to thereby reduce the manufacturing costs, and a display device with a large size and high definition can be implemented.

Moreover, the transparent display device is implemented as the top emission type to thereby increase the luminance and reduce the power consumption. At this time, the second electrode is electrically connected to the auxiliary electrode through the first connection pattern, so that the resistance of the second electrode is lowered. Additionally, the second electrode is electrically connected to the second connection pattern of the transparent area, thereby improving the electrical contact property between the second electrode and the first connection pattern.

It will be apparent to those skilled in the art that various modifications and variations can be made in a device of the present disclosure without departing from the sprit or scope of the embodiments. Thus, it is intended that the present disclosure covers the modifications and variations of this invention provided they come within the scope of the appended claims and their equivalents.

What is claimed is:

1. A transparent display device comprising:
   a substrate having an emission area and a transparent area;
   a light-emitting diode provided in the emission area and including a first electrode, a light-emitting layer, and a second electrode;
   a first connection pattern provided between the emission area and the transparent area;
   a second connection pattern provided in the transparent area and connected to the first connection pattern; and
   a bank of an insulating material and disposed over the first electrode, the first connection pattern, and the second connection pattern,
   wherein the second electrode overlaps the first connection pattern and is electrically connected to the first connection pattern and the second connection pattern, and
   wherein the second connection pattern is formed of a transparent conductive material.

2. The transparent display device of claim 1, wherein the first connection pattern is formed of a same material and on a same layer as the first electrode.

3. The transparent display device of claim 1, wherein the second electrode overlaps the second connection pattern.

4. The transparent display device of claim 1, wherein the bank is disposed between the second connection pattern and the second electrode.

5. The transparent display device of claim 1, wherein the bank is in contact with a top surface of the second connection pattern.

6. The transparent display device of claim 1, wherein the second connection pattern overlaps and contacts the first connection pattern.

7. The transparent display device of claim 1, wherein each of the first electrode and the first connection pattern includes a first layer, a second layer, and a third layer, and the second connection pattern and the first layer of the first connection pattern are formed as one body.

8. The transparent display device of claim 7, wherein the second layer is disposed between the first layer and the third layer, and the first layer is disposed between the substrate and the second layer.

9. The transparent display device of claim 7, wherein the second layer is disposed between the first layer and the third layer, and the third layer is disposed between the substrate and the second layer.

10. The transparent display device of claim 1, wherein each of the first electrode and the first connection pattern includes a first layer, a second layer, and a third layer, and the second connection pattern extends from an end of the first layer of the first connection pattern into the transparent area.

11. The transparent display device of claim 1, wherein the light-emitting layer includes a first charge auxiliary layer, a light-emitting material layer, and a second charge auxiliary layer, and the second charge auxiliary layer is disposed between the second electrode and the first connection pattern and between the second electrode and the second connection pattern.

12. The transparent display device of claim 1, wherein the bank is disposed between the second connection pattern and the second charge auxiliary layer.

13. The transparent display device of claim 1, wherein the bank has a first opening, a second opening, and an auxiliary contact hole, and wherein the first opening corresponds to the emission area, the second opening corresponds to the transparent area, and the auxiliary contact hole corresponds to the first connection pattern.

14. The transparent display device of claim 1, wherein the bank includes a first bank of a hydrophilic property and a second bank of a hydrophobic property.

15. The transparent display device of claim 14, wherein the first bank and the second bank are formed as one body.

16. The transparent display device of claim 1, wherein the emission area and the transparent area are arranged along a first direction, and the emission area includes a first emission area, a second emission area, and a third emission area arranged along a second direction perpendicular to the first direction.

17. The transparent display device of claim 1, wherein the emission area and the transparent area are arranged along a first direction, and the emission area includes a first emission area, a second emission area, and a third emission area arranged along the first direction.

18. The transparent display device of claim 17, wherein the light-emitting layers of emission areas adjacent to each other along a second direction perpendicular to the first direction are connected to each other to form one body.

19. The transparent display device of claim 1, further comprising at least one auxiliary electrode between the substrate and the first connection pattern, wherein the second electrode is electrically connected to the at least one auxiliary electrode through the first connection pattern and the second connection pattern.

20. The transparent display device of claim 1, further comprising at least one thin film transistor between the substrate and the first electrode, wherein the first electrode is connected to the at least one thin film transistor.

* * * * *